United States Patent
Nakae et al.

(10) Patent No.: US 7,529,021 B2
(45) Date of Patent: May 5, 2009

(54) SEMICONDUCTOR LASER MODULE, OPTICAL AMPLIFIER, AND METHOD OF MANUFACTURING THE SEMICONDUCTOR LASER MODULE

(75) Inventors: Masashi Nakae, Tokyo (JP); Takeshi Aikiyo, Tokyo (JP); Toshio Kimura, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 11/831,523

(22) Filed: Jul. 31, 2007

(65) Prior Publication Data

US 2008/0044936 A1 Feb. 21, 2008

Related U.S. Application Data

(63) Continuation of application No. 10/747,451, filed on Dec. 30, 2003, now Pat. No. 7,259,905, which is a continuation of application No. PCT/JP02/06681, filed on Jul. 2, 2002.

(30) Foreign Application Priority Data

| Jul. 2, 2001 | (JP) | 2001-201513 |
| Jul. 17, 2001 | (JP) | 2001-217265 |
| Oct. 23, 2001 | (JP) | 2001-325705 |
| Feb. 8, 2002 | (JP) | 2002-033252 |
| Apr. 22, 2002 | (JP) | 2002-119974 |
| Jun. 14, 2002 | (JP) | 2002-175116 |

(51) Int. Cl.
*H01S 3/00* (2006.01)

(52) U.S. Cl. .................. 359/333; 372/43.01

(58) Field of Classification Search .............. 359/333, 359/341.1; 385/52; 372/43.01
See application file for complete search history.

(56) References Cited

U.S. PATENT DOCUMENTS

| 4,805,977 A | 2/1989 | Tamura et al. |
| 5,692,082 A | 11/1997 | Fukushima |
| 6,362,919 B1 | 3/2002 | Flanders |
| 6,618,405 B2 | 9/2003 | Kimura et al. |

(Continued)

FOREIGN PATENT DOCUMENTS

EP 0 312 652 A1 4/1989

(Continued)

OTHER PUBLICATIONS

Yoshihiro Emori et al, "Demonstration of Broadband Raman Amplifiers : a Promising Application of High-power Pumping Unit", Furukawa Denko Giho No. 105 (Jan. 2000) pp. 59-62, Furukawa Electric Co., Ltd.

(Continued)

*Primary Examiner*—Mark Hellner
(74) *Attorney, Agent, or Firm*—Oblon, Spivak, McClelland, Maier & Neustadt, P.C.

(57) ABSTRACT

A semiconductor laser module has a semiconductor laser device; a package for housing the semiconductor laser device; a PBC fixed in the package for polarization-synthesizing two laser beams output from the semiconductor laser device; a depolarizing element fixed in the package for depolarizing a synthesizing light output from the PBC; and an optical fiber for receiving a light output from the depolarizing element.

3 Claims, 29 Drawing Sheets

U.S. PATENT DOCUMENTS 6,625,347 B1     9/2003     Wu

FOREIGN PATENT DOCUMENTS

| | | |
|---|---|---|
| EP | 1 085 662 | 9/2000 |
| EP | 1 085 622 A1 | 3/2001 |
| JP | 60-76707 | 5/1985 |
| JP | 63-115145 | 5/1988 |
| JP | 1-291480 | 11/1989 |
| JP | 03-135511 | 6/1991 |
| JP | 04-180282 | 6/1992 |
| JP | 04-369888 * | 12/1992 |
| JP | 5-53082 | 3/1993 |
| JP | 5-121838 | 5/1993 |
| JP | 7-72426 | 3/1995 |
| JP | 7-99477 | 4/1995 |
| JP | 8-248259 | 9/1996 |
| JP | 08-254668 | 10/1996 |
| JP | 9-162490 | 6/1997 |
| JP | 9-214022 | 8/1997 |
| JP | 10-62720 | 3/1998 |
| JP | 2000-31575 | 1/2000 |
| JP | 2001-59925 | 3/2001 |
| JP | 2002-023019 | 1/2002 |

OTHER PUBLICATIONS

Yoshihiro Emori, et al., "Demonstration of Broadband Raman Amplifiers: a Promising Application of High-power Pumping Unit", http://www.furukawa.co.jp/review/backnum.htm, WDM Team. Opto-technology Lab., R & D Div. No. 19, Apr. 2000, pp. 42-45 (with English translation).

Patent Abstracts of Japan, JP 62-189422, Aug. 19, 1987.

* cited by examiner

Fig. 9(A)
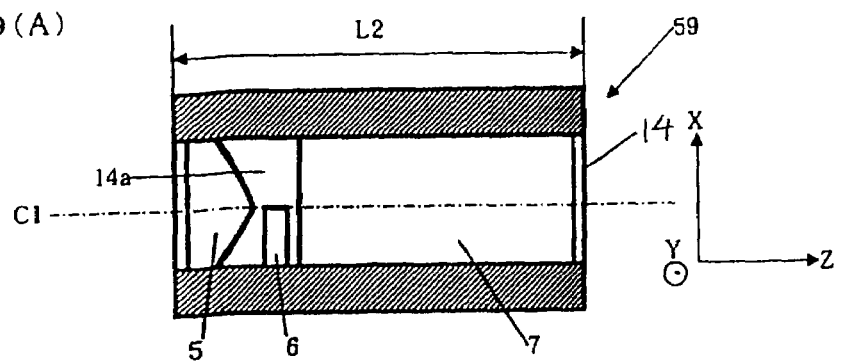
Fig. 9(B)
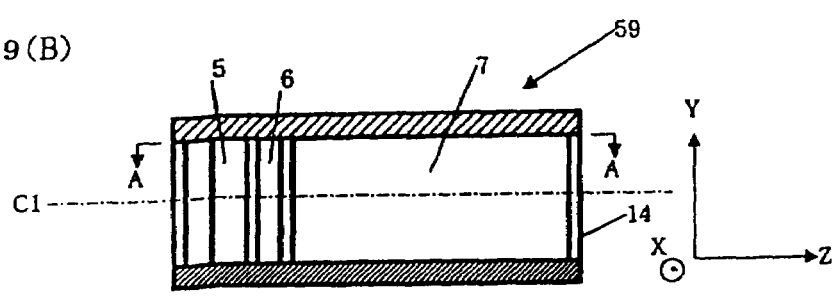
Fig. 9(C)
Fig. 9(D)
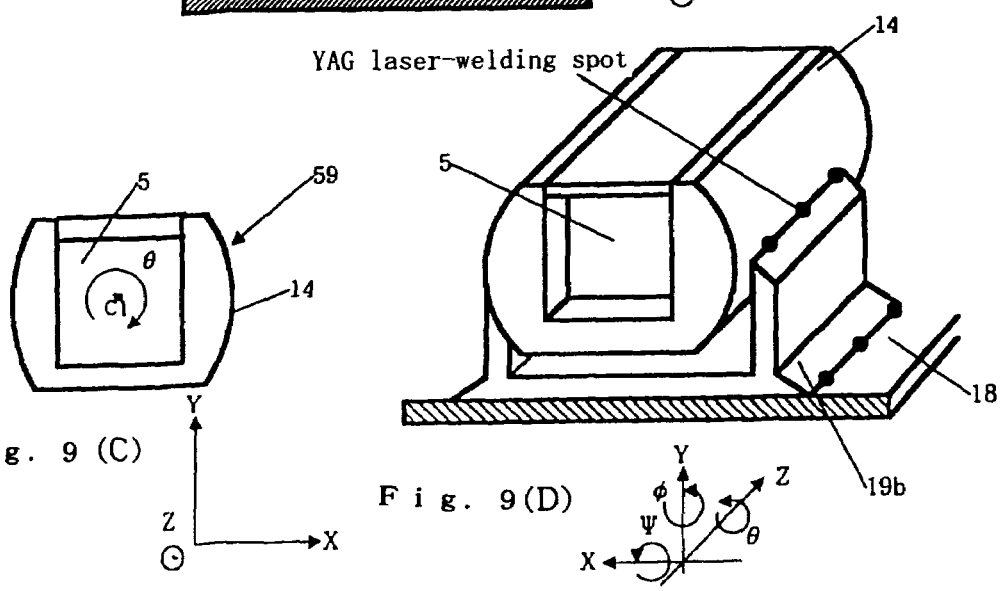

US 7,529,021 B2

SEMICONDUCTOR LASER MODULE, OPTICAL AMPLIFIER, AND METHOD OF MANUFACTURING THE SEMICONDUCTOR LASER MODULE

CROSS-REFERENCE TO RELATED APPLICATIONS

This application is a Continuation of and is based upon and claims the benefit of priority under 35 U.S.C. §120 for U.S. Ser. No. 10/747,451, filed Dec. 30, 2003, which is a Continuation of PCT/JP02/06681, filed Jul. 2, 2002, and claims the benefit of priority under 35 U.S.C. §119 from Japanese Patent Application Nos. 2001-201513, filed Jul. 2, 2001, 2001-217265, filed Jul. 17, 2001, 2001-325705, filed Oct. 23, 2001, 2002-033252, filed Feb. 8, 2002, 2002-119974, filed Apr. 22, 2002, and 2002-175116, filed Jun. 14, 2002, the entire contents of each which are incorporated herein by reference.

BACKGROUND (1) Technical Field

The present invention relates to a semiconductor laser module, a Raman amplifier, and a method of manufacturing the semiconductor laser module, and more specifically to a semiconductor laser module in which laser light emitted from a semiconductor laser device is coupled to an optical fiber, a Raman amplifier, and a method of manufacturing the semiconductor laser module.

(2) Description of Related Art

With progress in the optical communications based on a dense wavelength division multiplexing transmission system over the recent years, a higher output is increasingly demanded to a pumping light source used for the optical amplifier.

Further, a greater expectation is recently given to a Raman amplifier as an amplifier for amplifying the light having a much broader band than by an EDFA (erbium-doped optical fiber amplifier) that has hitherto been employed as the optical amplifier. The Raman amplifier may be defined as a method of amplifying the optical signals, which utilizes such a phenomenon that a gain occurs on the side of frequencies as low as 13 THz on the basis of a pumping wavelength due to the stimulated Raman scattering occurred when the pumping light enter an optical fiber, and, when the signal beams having the wavelength range containing the gain described above are inputted to the optical fiber in the thus excited state, these signals are amplified.

According to the Raman amplification, the signal beams are amplified in a state where a polarization direction of the signal beams is coincident with a polarization direction of the pumping lights, and it is therefore required that an influence by a deviation between polarization directions of the signal beams and of the pumping lights be minimized. For attaining this, a degree of polarization (DOP) has hitherto been reduced by obviating the polarization of the pumping lights, which may be called depolarization.

A conventionally known technique for reducing the degree of polarization of a pumping light source is to couple a depolarizer (PMF: polarization maintaining fiber) to the tip of an output optical fiber that outputs laser light from a semiconductor laser module to the outside, and to arrange the polarization maintaining fiber with its principal axis tilted at an angle of 45 degrees with respect to the laser polarization direction (hereinafter the technique is referred to as Prior Art 1).

As a method for obtaining an increased optical output from a pumping light source and simultaneously depolarizing a laser beam emitted therefrom, one in which two laser beams emitted from two semiconductor laser devices oscillating at identical wavelengths are polarization-synthesized by use of a polarization-synthesizing coupler is known, as disclosed in U.S. Pat. No. 5,589,684.

FIG. 28 is an explanatory diagram showing a conventional semiconductor laser apparatus as disclosed in U.S. Pat. No. 5,589,684.

As shown in FIG. 28, the conventional semiconductor laser apparatus comprises a first semiconductor laser device 100 and a second semiconductor laser device 101 emitting laser beams of identical wavelengths in mutually orthogonal directions; a first collimating lens 102 configured to collimate the laser beam emitted from the first semiconductor laser device 100; a second collimating lens 103 configured to collimate the laser beam emitted from the second semiconductor laser device 101; a polarization-synthesizing coupler (i.e. cube beam splitter) 104 configured to polarization-synthesize the laser beams that were collimated by the first collimating lens 102 and the second collimating lens 103; a convergent lens 105 configured to converge the laser beams polarization-synthesized by the polarization-synthesizing coupler 104; and an optical fiber 106 for receiving the laser beams converged by the convergent lens 105 and letting the laser beams travel outside.

In the prior art, the laser beams are emitted from the first semiconductor laser device 100 and the second semiconductor laser device 101 in mutually orthogonal directions and are polarization-synthesized by the polarization-synthesizing coupler 104 to obtain a laser beam of reduced DOP from the optical fiber 106 (hereinafter the technique is referred to as Prior Art 2).

In addition, the applicant of the present invention has proposed a semiconductor laser module in which two laser beams emitted from a single semiconductor laser device having two stripes are polarization-synthesized and received by an optical fiber. (See Japanese patent application No. 2001-402819, for example. This technology will hereinafter be called a related art.)

FIG. 29 is an explanatory diagram schematically showing a configuration of the semiconductor laser module of the related art.

As shown in FIG. 29, the semiconductor laser module M12 of the related art includes a single semiconductor laser device 2 having a first stripe (a light-emitting stripe) 9 and a second stripe 10 formed with a spacing interposed therebetween and emitting a first laser beam K1 and a second laser beam K2 from a front end face (i.e. an end face on right-hand side in FIG. 29) of the first stripe 9 and the second stripe 10 respectively; a first lens 4 configured such that the first laser beam K1 and the second laser beam K2 are incident therealong and separated in the direction in which the first and second stripes 9, 10 are arrayed; a half-wave plate 6 configured to rotate a polarization direction of at least one of the first and second laser beam K1, K2 (i.e. the first laser beam K1 in FIG. 29) by a predetermined angle (by 90 degrees, for example); a PBC (polarization beam combiner) 7 configured to optically synthesize therealong the first laser beam K1 and the second laser beam K2; and an optical fiber 8 for receiving the laser beams emerging from the PBC 7 and letting the beams to travel outside.

In addition, a prism 5 is disposed between the first lens 4 and the half-wave plate 6 so that the first laser beam K1 and the second laser beam K2 are incident thereon and output therefrom along their respective optical axes parallel to each other. Further, a second lens 16 is disposed between the PBC 7 and the optical fiber 8 in order to optically couple the first and second laser beams K1, K2 polarization-synthesized by the PBC 7 to the optical fiber 8.

The first laser beam K1 and the second laser beam K2 emitted respectively from the front end face 2a of the first stripe 9 and the second stripe 10 of the semiconductor laser device 2 travel through the first lens 4, intersect and separate until the separation between the two beams is enough, before entering the prism 5.

The first laser beam K1 and the second laser beam K2 are made parallel to each other during propagation through the prism 5, and are output from there. The first laser beam K1 then enters the half-wave plate 6, where its polarization direction is rotated by 90 degrees, and then enters a first input port 7a of the PBC 7, while the second laser beam K2 enters a second input port 7b of the PBC 7.

The first laser beam K1 incident on the first input port 7a and the second laser beam K2 incident on the second input port 7b are synthesized along the PBC 7, and output from an output port 7c.

The laser beams emerging from the PBC 7 are then converged by the second lens 16, enter an end face of the optical fiber 8 supported by the ferrule 23, and propagate to outside.

In Prior Art 1, when the polarization maintaining fiber that serves as a depolarizer is fusion-spliced to the end of the output optical fiber, it is difficult to position with accuracy the polarization maintaining fiber so that the principal axis of the polarization maintaining fiber tilts at an angle of 45 degrees with respect to the direction in which the laser light is polarized. Another problem of Prior Art 1 is high cost because a long polarization maintaining fiber has to be used in order to lower the degree of polarization satisfactorily.

In Prior Art 2, the first semiconductor laser device 100 and the second semiconductor laser device 200 are different from each other in terms of light intensity and efficiency in coupling with the optical fiber. For that and other reasons, Prior Art 2 in some cases fails to satisfactorily lower the degree of polarization (DOP) of laser light that is optically coupled to the optical fiber 106 through polarization synthesis.

In the semiconductor laser module according to the related art, the amount of light coupled to the optical fiber 8 differs from the laser beam K1 to the laser beam K2 because of the following reasons, for example, (1) the laser beam K1 alone passes through the half-wave plate 6, and the length of light path to the optical fiber 8 is not equal for the laser beam K1 and K2, which means that the loss the laser beam K1 suffers along the propagation is different from the loss the laser beam K2 suffers along the propagation, (2) the difference in optical length of the light path to the optical fiber 8 between the laser beam K1 and K2 causes a difference in position of the beam waist between laser beam that is formed after K1 exits the second lens 16 and laser beam that is formed after K2 exits the second lens 16, and (3) the laser beam K1 and K2 emitted from the first and second stripes, are different from each other in intensity, spreading angle, and others. The difference in beam amount due to those and other reasons sometimes causes the semiconductor laser module to fail in satisfactorily lowering the degree of polarization (DOP) of laser light coupled to the optical fiber 8.

Furthermore, the long-term use may degrade one of the stripes and change the position of the members relative to one another, which could lead to an increase in degree of polarization.

In addition, in Prior Art 2 and the semiconductor laser module according to related art, when efficiency in coupling each laser light to the optical fiber is changed due to a change in environmental temperature or the like, degree of polarization of laser light outputted from the optical fiber could fluctuate.

BRIEF SUMMARY OF INVENTION

The present invention has been made to solve the above problems, and an object of the present invention is therefore to provide an inexpensive semiconductor laser module capable of steadily providing laser light of low degree of polarization, an optical amplifier, and a method of manufacturing the semiconductor laser module.

To solve the above problems, the present invention employs the following structure. That is, a semiconductor laser module according to the present invention is characterized by including: a semiconductor laser device with a stripe for emitting laser light; an optical fiber for receiving and transmitting laser light that has been emitted from the stripe; a first lens where laser light emitted from the stripe enters to be optically coupled to the optical fiber; a package for housing the semiconductor laser device; and a depolarizing element placed between the semiconductor laser device and the optical fiber to depolarize laser light emitted from the semiconductor laser device.

In the invention structured as above, the depolarizing element is placed between the semiconductor laser device and the optical fiber to depolarize laser light emitted from the semiconductor laser device. Therefore, depolarized laser light can be obtained from the optical fiber with a simple and inexpensive structure.

A second lens may be placed between the first lens and the optical fiber to receive laser light that has exited the first lens and to make the light focus on the optical fiber. In this case, the depolarizing element may be placed between the first lens and the second lens, and the first lens may have a function of turning laser light emitted from the stripe into collimated light.

In the invention structured as above, the second lens is placed between the first lens and the optical fiber, and the depolarizing element is placed between the first lens and the second lens. This makes it easier to design an optical system from a semiconductor laser device to an optical fiber.

The package may have a cooling device fixed to the interior, and the semiconductor laser device and the depolarizing element may be fixed to the same base, which is fixed onto the cooling device.

In the thus structured invention, the temperature of the depolarizing element can be kept constant by the cooling device, and therefore laser light obtained from the optical fiber can have a stable degree of polarization.

The optical fiber receives the laser light that has passed through an end face of the package, and the depolarizing element may be fixed to the end face of the package.

In the invention structured as above, the depolarizing element is aligned and fixed to the end face of the package, and therefore the semiconductor laser module can have a simplified structure.

Either the first lens or the second lens and the depolarizing element may be held in the same holder. Alternatively, either the first lens or the second lens may be held in a holder different from one that holds the depolarizing element, and the holders may be joined each other.

In the invention structured as above, the depolarizing element is fixed to the lens, and therefore the depolarizing element can be aligned at the same time the lens is aligned.

A semiconductor laser module according to the present invention is characterized by including: a semiconductor laser device with stripes for emitting laser light; an optical fiber for receiving and transmitting laser light that has been emitted from the stripe; a first lens where laser light emitted from the stripe enters to be optically coupled to the optical fiber; a package for housing the semiconductor laser device; a polarized wave synthesizing element placed between the semiconductor laser device and the optical fiber to combine two polarized laser lights emitted from two of the stripes; and a depolarizing element placed between the polarized wave synthesizing element and the optical fiber to depolarize the synthesized light that has exited the polarized wave synthesizing element.

In the invention structured as above, the semiconductor laser module is provided with the depolarizing element to depolarize synthesized light emitted from the polarized wave synthesizing element. Therefore, when polarization synthesis by the polarized wave synthesizing element fails to provide a desired degree of polarization by itself due to a difference in intensity, spreading angle, optical length of the propagation beam path, amount of attenuation experienced along the propagation beam path, or the like between two laser beams, depolarization by the depolarizing element makes it possible to obtain laser light of satisfactorily low degree of polarization from the optical fiber.

A second lens may be placed between the first lens and the optical fiber to receive laser light that has exited the first lens and to make the light focus on the optical fiber. In this case, the depolarizing element may be placed between the polarized wave synthesizing element and the second lens.

In the invention structured as above, the second lens is placed between the first lens and the optical fiber, and the depolarizing element is placed between the polarized wave synthesizing element and the second lens. This makes it easier to design an optical system from a polarized wave synthesizing element to an optical fiber.

The package may have a cooling device fixed to the interior, and the semiconductor laser device and the depolarizing element may be fixed to the same base, which is fixed onto the cooling device.

In the thus structured invention, the temperature of the depolarizing element can be kept constant by the cooling device, and therefore laser light obtained from the optical fiber can have a stable degree of polarization.

The optical fiber receives laser light that has passed through an end face of the package, and the depolarizing element may be fixed to the end face of the package.

In the invention structured as above, the depolarizing element is aligned and fixed to the end face of the package, and therefore the semiconductor laser module can have a simplified structure.

The second lens and the depolarizing element may be held in the same holder.

Alternatively, the second lens may be held in a holder different from one that holds the depolarizing element, and the holders may be joined each other.

In the invention structured as above, the depolarizing element is fixed to the lens, and therefore the depolarizing element can be aligned at the same time the lens is aligned.

The semiconductor laser device is a single semiconductor laser device that has a first stripe and a second stripe, which are placed apart from each other, and the two laser beams may be first laser beam and second laser beam emitted from the first stripe and the second stripe, respectively. In the above structure, the gap between the first stripe and the second stripe may be set to 100 or less, and the first lens may be a single lens which separates the first and second laser beam emitted from the first and second stripes, respectively, in the direction along which the first and second stripes are placed side by side.

In the invention structured as above, the semiconductor laser device is a single semiconductor laser device that has two stripes. Therefore, the semiconductor laser module can have a small size, and the cooling device for cooling heat that is generated from the semiconductor laser device 2 can be reduced in size, which leads to reduction in power consumption. Furthermore, since the gap between the stripes is as narrow as 100 μm, or even narrower, the two laser beams can have similar characteristics to make it easy to lower the degree of polarization of synthesized beam that is obtained by combining the two polarized laser beams. Moreover, the use of the single lens to separate two laser beams in the direction along which the two stripes are placed side by side facilitates polarization synthesis even when the stripes are close to each other.

Each stripe may be provided with a diffraction grating for selecting beam of given wavelength.

In the invention structured as above, laser beam that is low in relative intensity noise (RIN) and that has stabilized oscillation wavelength can be obtained.

Each strip may emit laser beam that has plural oscillation longitudinal modes within its oscillation spectrum.

In the invention structured as above, the diffraction gratings stabilize the wavelength of laser beams emitted from their respective stripes, and the laser beams each oscillate in plural oscillation longitudinal modes. Therefore, the length of the depolarizing element necessary for depolarization can be shortened.

Laser beam emitted from one stripe may have a wavelength different from that of laser beam emitted from the other stripe. The wavelength of an oscillation longitudinal mode may vary from laser beam emitted from one stripe to laser beam emitted from the other stripe.

In the invention structured as above, the oscillation longitudinal mode wavelength varies from laser beam emitted from one stripe to laser beam emitted from the other stripe, and therefore the degree of polarization can be lowered without fail when the two laser beams are put through polarization synthesis.

The oscillation wavelength spectrum constituted of oscillation longitudinal modes of one laser beam and the oscillation wavelength spectrum constituted of oscillation longitudinal modes of the other laser beam may not intersect with each other within a range where the difference value from the maximum intensity is 3 dB or less.

In the invention structured as above, the oscillation spectrum of one laser beam does not overlap the oscillation spectrum of the other laser beam in a high intensity range. This makes it possible to lower the degree of polarization of synthesized beam without fail even when the oscillation modes overlap with each other.

An optical amplifier of the present invention is composed of the above-described semiconductor laser module, which serves as a pumping light source.

In the thus structured Raman amplifier, the semiconductor laser module that outputs laser light of low degree of polarization is used as a pumping light source, and therefore the amplification gain is less dependent on polarization.

According to the present invention, a method of manufacturing a semiconductor laser module, which includes: a semiconductor laser device for emitting laser light; an optical fiber for receiving and transmitting laser light that has been emitted from the semiconductor laser device; at least one lens where laser light emitted from the semiconductor laser device enters to be optically coupled to the optical fiber; a package for housing the semiconductor laser device; and a depolarizing element placed between the semiconductor laser device and the optical fiber to depolarize laser light emitted from the semiconductor laser device, is characterized by including a step of positioning the depolarizing element by rotating the depolarizing element about an optical axis of the laser light emitted from the depolarizing element to set the degree of polarization of the laser light to a given value or less.

The depolarizing element may be positioned by rotating the depolarizing element about the optical axis of the laser light while being fixed to the lens.

According to the thus structured semiconductor laser module manufacturing method, depolarized laser light can be obtained from the optical fiber. Furthermore, manufacture of the semiconductor laser module takes shorter period of time because the depolarizing element is aligned at the same time the lens is aligned.

BRIEF DESCRIPTION OF DRAWINGS

FIG. 9(A) is a plan sectional view of a polarization-synthesizing module taken along the line A-A in FIG. 9(B); FIG. 9(B) is a side sectional view thereof; FIG. 9(C) is a front view thereof; FIG. 9(D) is a perspective view thereof;

FIGS. 18(A) and (B) are explanatory diagrams showing a structure of a semiconductor laser device in accordance with the fifth embodiment of the present invention, of which

DETAILED DESCRIPTION OF PREFERRED EMBODIMENTS

Embodiments of the present invention will be described below with reference to the drawings.

First Embodiment

Figure 1:
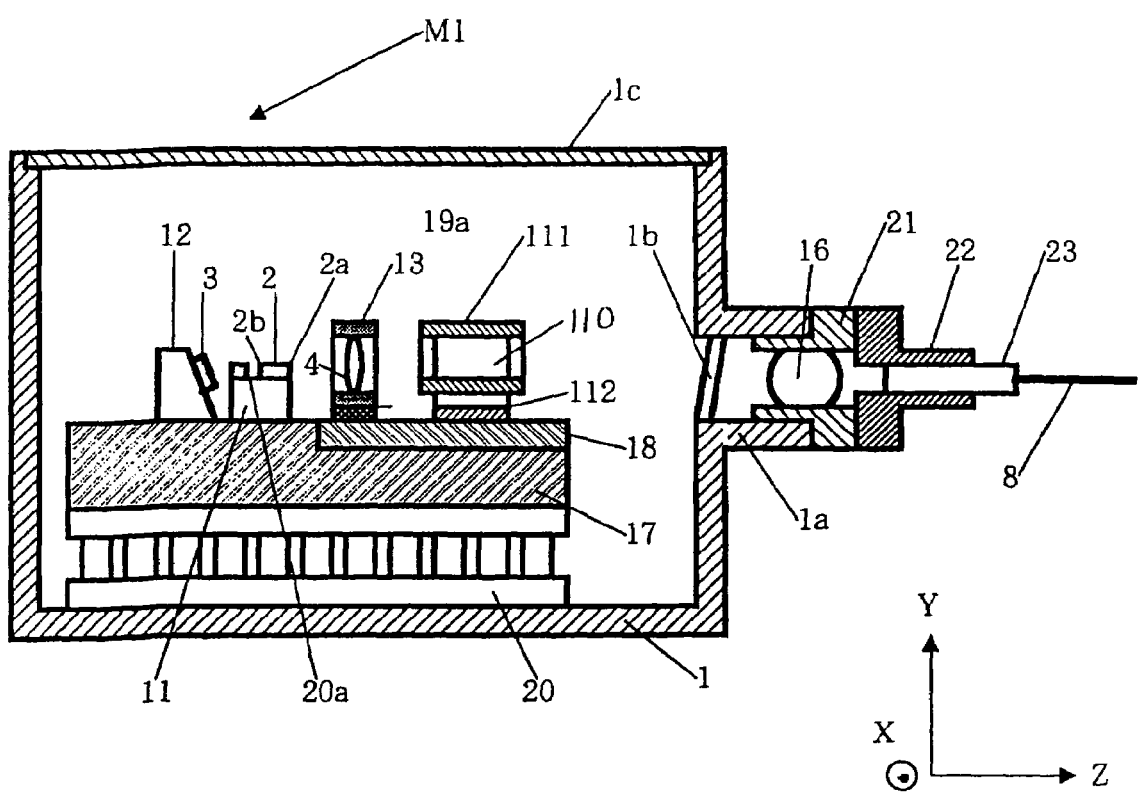
FIG. 1 is a side sectional view showing a configuration of a semiconductor laser module in accordance with a first embodiment of the present invention.

FIG. 1 is a side sectional view showing a structure of a semiconductor laser module M1 according to a first embodiment of the present invention.

As shown in FIG. 1, a semiconductor laser module M1 according to the first embodiment of the present invention includes a package 1 whose interior is hermetically sealed, a semiconductor laser device 2 which has a stripe-shaped active layer (hereinafter referred to as stripe) for emitting laser beams and which is encased in the package 1, a photodiode (a light receiving element) 3, a first lens 4, a depolarizing element 110, and an optical fiber 8.

The semiconductor laser device 2 is fixedly attached on to a chip carrier 11.

The photodiode 3 receives monitoring laser beam emitted from an end face 2b on a rear side (left side in FIG. 1) of the stripe of the semiconductor laser device 2. The photodiode 3 is fixedly attached to a photodiode carrier 12.

The first lens 4 is a collimating lens for turning laser beam that is emitted from an end face 2a on the front side (right side in FIG. 1) of the stripe of the semiconductor laser device 2 into parallel beam. The first lens 4 is held by a first lens holding member 13.

The depolarizing element 110 is made from a birefringence material such as rutile or $YVO_4$.

Figure 2A:
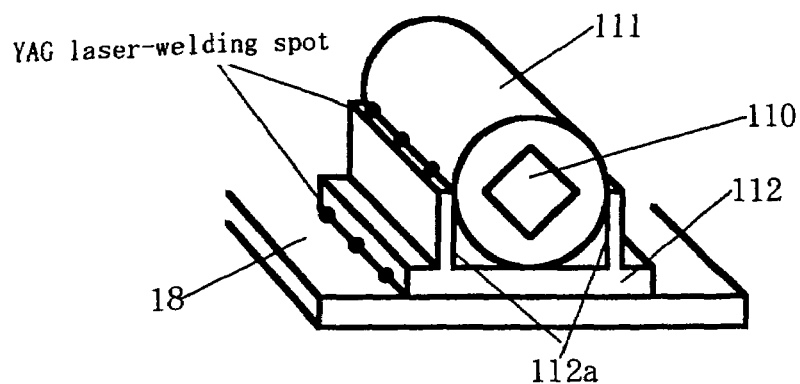
FIG. 2(A) is a perspective view showing a third supporting member that supports the depolarizing element.
Figure 2A:
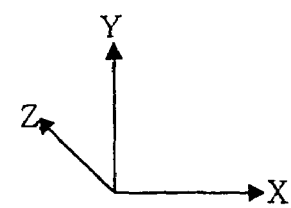
Figure 2B:
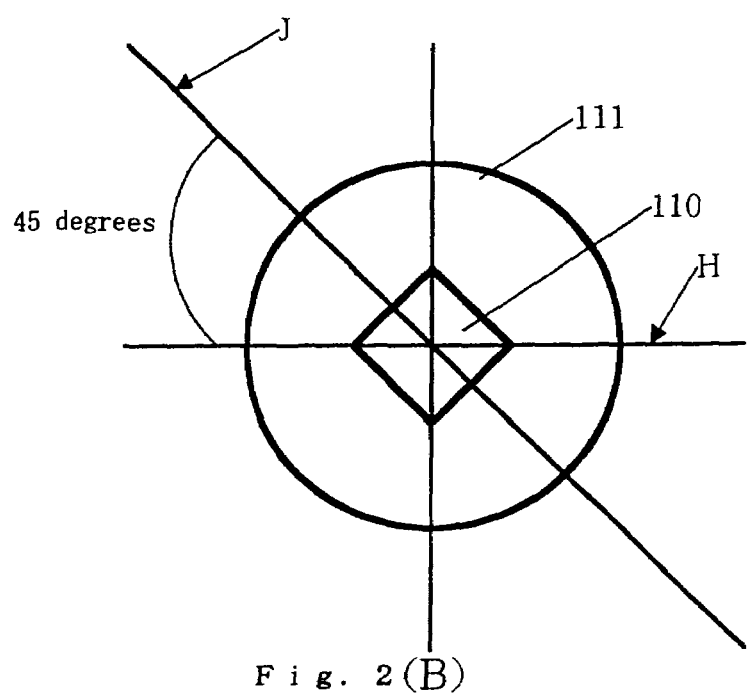
FIG. 2(B) is an explanatory diagram for illustrating how the depolarizing element is positioned.

FIG. 2(A) is a perspective view showing a third supporting member 112 that supports the depolarizing element 110, and FIG. 2(B) is an explanatory diagram for illustrating how the depolarizing element is positioned.

As shown in FIG. 2(A), the depolarizing element 110 is held in a cylindrically-shaped holder member 111, which is made from a material suitable for YAG laser welding (for example, SUS 403, 304, or the like). The holder member 111 is fixed by YAG laser welding while positioned between two erect walls 112a of the third supporting member 112, which is made of metal to have an approximately U shape in section and which is fixed on a second base 18.

As shown in FIG. 2(B), the depolarizing element 110 is arranged along a beam path of laser beam such that a principal axis J forms an angle of about 45 degrees with respect to a polarization direction H of incident beam. With this arrangement, the laser light can be depolarized. The length of the depolarizing element 110 is determined by the polarization dispersion of the birefringent material and the width of the envelope curve of the wavelength spectrum of incident light. If a beam has a thin spectrum, the depolarizing element 110 is long, whereas the depolarizing element 110 is short if a beam has a thick spectrum. Specifically, when formed of rutile, the depolarizing element 110 is about 5 mm in length if a Fabry-Perot laser having a spectrum width of 5 to 8 nm is used, and is about 10 mm in length if the semiconductor laser module is provided with a diffraction grating, which will be described later, to reduce the spectrum width to 1 nm or less.

When positioning the depolarizing element 110, a polarization measurement device is placed in a position where the polarization measurement device can receive light exiting the depolarizing element 110 to measure the degree of polarization of the exiting light while rotating the holder member 111 about the central axis between the two erect walls 112a of the third support member 112. At a position where the minimum degree of the polarization is measured, the holder member 111 is fixed by YAG laser welding to the two erect walls 112a of the third supporting member 112. This facilitates alignment of the depolarizing element 110.

The chip carrier 11 and the photodiode carrier 12 are fixed onto a first base 17, which is made from a CuW-based alloy. The first lens holding member 13 and the holder member 111 are fixed onto the second base 18, which is made of stainless steel and which is fixed on the first base 17 by silver alloy brazing.

A cooling device 20 composed of a Peltier element is placed under the first base 17. An increase in temperature caused by heat that is generated from the semiconductor laser device 2 is detected by a thermistor 20a, which is placed on the chip carrier 11. The cooling device 20 is controlled so that it keeps the temperature detected by the thermistor 20a constant. In this way, laser light emitted from the semiconductor element 2 can be increased in power and stabilized.

According to this embodiment, a temperature adjustment by the cooling device 20 keeps the temperature of the depolarizing element 110 constant. Therefore, a change in characteristic, which accompanies a change in temperature of the depolarizing element 110, can be avoided, and stable depolarization is obtained.

The package 1 has in its side a flange portion 1a, where a window portion 1b is provided to receive light that has passed through the depolarizing element 110. A second lens holding member 21 for holding a second lens 16 is fixed at an end of the flange portion 16 1a. The second lens collects laser light that has exit the depolarizing element 110. A ferrule 23 holding an optical fiber 8 through a metal slide ring 22 is fixed to an end of the second lens holding member 21 by YAG laser welding.

Laser light emitted from the front side end face 2a of the stripe of the semiconductor laser device 2 is turned into parallel light (collimated light) while passing through the first lens 4 and then enters the depolarizing element 110.

The laser light is depolarized by the depolarizing element 110 and then passes through the window portion 1b to be collected by the second lens 16. The laser light enters the end face of the optical fiber 8 that is held by the ferrule 23, and is sent to the outside.

According to the first embodiment of the present invention, the depolarizing element 110 fixed inside the package 1 depolarizes laser light emitted from the semiconductor laser device 2. Therefore, laser light of low degree of polarization can be obtained easily and stably.

In addition, the depolarizing element is placed between the first lens and the second lens to make it easy to design an optical system from the semiconductor laser device to the optical fiber.

Second Embodiment

Figure 3:
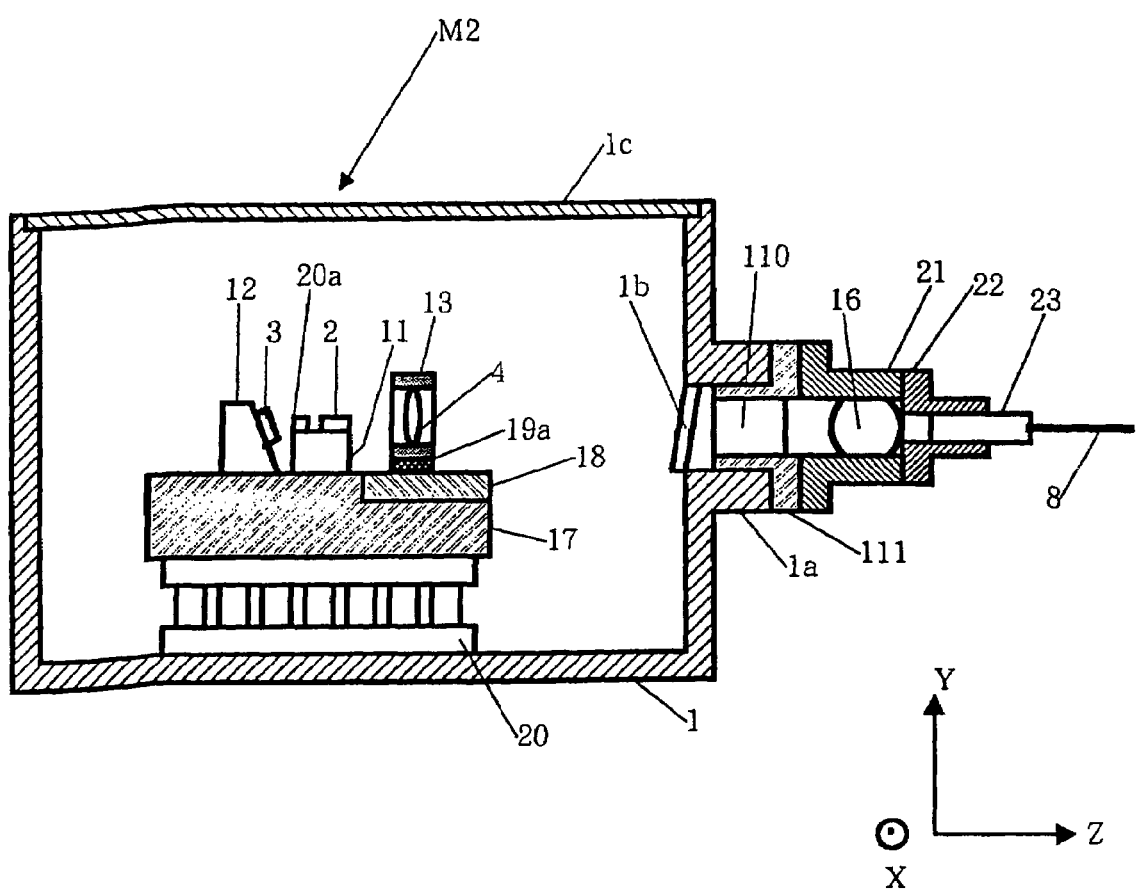
FIG. 3 is a side sectional view showing a configuration of a semiconductor laser module in accordance with a second embodiment of the present invention.

FIG. 3 is a side sectional view showing a structure of a semiconductor laser module M2 according to a second embodiment of the present invention.

As shown in FIG. 3, the semiconductor laser module M2 according to the second embodiment of the present invention is characterized in that a holder member 111 holding a depolarizing element 110 is fixed to an end of a flange portion 1a formed in a side of a package 1, and that a second lens holding member 21 holding a second lens 16 for collecting laser light that has exited the depolarizing element 110 is fixed to the holder member 111.

A ferrule 23 holding an optical fiber 8 through a metal slide ring 22 is fixed to an end of the second lens holding member 21 by YAG laser welding.

Described next is a method of manufacturing the semiconductor laser module M2 according to the second embodiment of the present invention.

First, a chip carrier 11 with a semiconductor laser device 2 fixed thereto and a photodiode carrier 12 with a monitor photodiode 3 fixed thereto are fixed onto a fist base 17, on which a second base 18 is fixed by silver alloy brazing in advance. Next, a first lens 4 held in a first lens holding member 13 is positioned such that laser light emitted from a stripe of the semiconductor laser device 2 is turned into parallel beam (collimated light). Then, the first lens holding member 13 is fixed to the second base 18 through a first supporting member 19a.

The first base 17 with the semiconductor laser 2, the monitor photodiode 3, and the first lens 4 fixed in this way is fixed by soldering onto a cooling device 20, which is fixed in advance onto a bottom plate of the package 1. The semiconductor laser device 2 and the photodiode 3 are electrically connected to a lead (not shown in the drawing) of the package 1 through a gold wire (not shown in the drawing).

Next, a lid 1c is placed on the package 1 in an inert gas (for example, $N_2$ or Xe) atmosphere, and the package is sealed airtightly by resistance welding of the perimeter of the lid.

Then, the holder member 111 holding the depolarizing element 110 and the second lens holding member 21 holding the second lens 16 are integrated into one by welding end faces of the two through YAG laser welding. The thus integrated holder member 111 and second lens holding member 21 (hereinafter referred to as integrated holder) is aligned at an end of the flange portion 1a of the package 1.

The first step of this alignment is to place the integrated holder at the end of the flange portion 1a with the depolarizing element 110 side facing the first lens 4. The integrated holder is positioned within a plane (within an X-Y plane) perpendicular to the central axis (the direction of an axis Z in FIG. 3) of the flange portion 1a so that the optical axis of laser light that has exited the second lens 16 becomes parallel to the central axis of the flange portion 1a. The polarization measurement device is then arranged so that the polarization measurement device can receive exit light from the second lens 16. The polarization measurement device measures the degree of polarization of the exit light while the integrated holder is rotated about the central axis. At a position where the minimum degree of polarization is measured, the integrated holder is fixed to the end of the flange portion 1a by YAG laser welding.

Lastly, the optical fiber 8 is positioned at an end of the second lens holding member 21 such that the maximum amount of light is coupled to the optical fiber 8, and then fixed. To fix the optical fiber 8, the ferrule 23 holding the tip of the optical fiber 8 is welded by YAG laser welding to the end of the second lens holding member 21 through the slide ring 22.

According to the second embodiment, the depolarizing element 110 is placed between the semiconductor laser device 2 and the optical fiber 8, and therefore depolarized laser light is obtained from the optical fiber 8. In addition, the depolarizing element is placed between the first lens and the second lens to make it easy to design an optical system from the semiconductor laser device to the optical fiber.

Furthermore, the second lens 16 and the depolarizing element 110 are integrated into one before alignment, thus facilitating the alignment of the second lens 16 and the depolarizing element 110 and shortening the period of time required for the alignment.

In the above embodiment, the holder member 111 holding the depolarizing element 110 and the second lens holding member 21 holding the second lens 16 are prepared separately and then integrated into one. Alternatively, the depolarizing element 110 and the second lens 16 may be fixed together to a single holder in advance.

Third Embodiment

Figure 4:
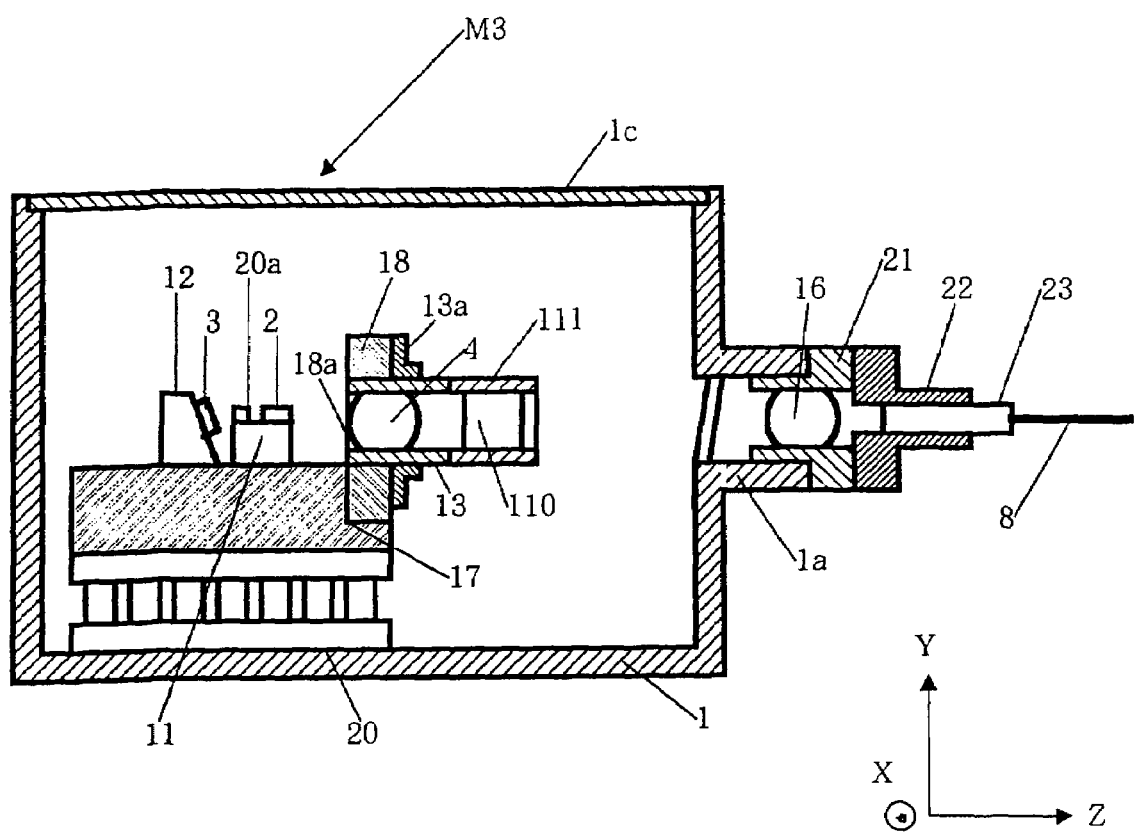
FIG. 4 is a side sectional view showing a configuration of a semiconductor laser module in accordance with a third embodiment of the present invention.

FIG. 4 is a side sectional view showing a structure of a semiconductor laser module M3 according to a third embodiment of the present invention.

As shown in FIG. 4, the semiconductor laser module M3 according to the third embodiment of the present invention is characterized in that a holder member 111 holding a depolarizing element 110 is fixed to a rear end of a first lens holding member 13 holding a first lens 4.

A base to which a semiconductor laser device 2 and the first lens 4 are to be fixed is roughly shaped like the letter L by fixing a second base 18 to an end of a first base 17 by silver alloy brazing. The first base 17 is flat and made of CuW. The second base 18 is made of stainless steel and has an opening 18a. The semiconductor laser device 2 is fixed to the first base 17 whereas the first lens holding member 13 is fit into the opening 18a of the second base 18 and is fixed along the perimeter of the opening 18a to the second base 18.

A method of manufacturing the semiconductor laser module M3 according to the third embodiment of the present invention will be described.

First, a chip carrier 11 with a semiconductor laser device 2 fixed thereto and a photodiode carrier 12 with a monitor photodiode 3 fixed thereto are fixed onto a fist base 17, on which a second base 18 is fixed by silver alloy brazing in advance.

Then, the first lens holding member 13 holding the first lens 4 and the holder member 111 holding the depolarizing element 110 are integrated into one by welding end faces of the two through YAG laser welding. The thus integrated first lens holding member 13 and holder member 111 (hereinafter referred to as integrated holder) is aligned at the opening 18a of the second base 18.

The first step of this alignment is to fit the integrated holder into the opening 18a of the second base 18 with the first lens 4 side facing the semiconductor laser device 2. In this state, the integrated holder is positioned such that laser light that has exited the first lens 4 becomes collimated light.

Then, a polarization measurement device is arranged so that the polarization measurement device can receive exit light from the depolarizing element 110. The polarization measurement device measures the degree of polarization of the exit light while the integrated holder is rotated about the central axis at the end of the opening 18a. At a position where the minimum degree of polarization is measured, the integrated holder is fixed by YAG laser welding through a slide ring 13a along the perimeter of the opening 18a to the second base 18.

The first base 17 where the semiconductor laser 2, the monitor photodiode 3, the first lens 4, and the depolarizing element 110 are fixed in this way is fixed by soldering onto a cooling device 20, which is fixed in advance onto a bottom plate of the package 1. The semiconductor laser device 2 and the photodiode 3 are electrically connected to a lead (not shown in the drawing) of the package 1 through a gold wire (not shown in the drawing).

Next, a lid 1c is placed on the package 1 in an inert gas (for example, $N_2$ or Xe) atmosphere, and the package is sealed airtightly by resistance welding of the perimeter of the lid.

Next, a second lens holding member 21 holding a second lens 16 is placed at an end of a flange portion 1a. The second lens holding member 21 is positioned within a plane (within an X-Y plane in FIG. 4) perpendicular to the central axis (the direction of an axis Z in FIG. 4) of the flange portion 1a so that the optical axis of laser light that has exited the second lens 16 becomes parallel to the central axis of the flange portion 1a. The thus positioned second lens holding member 21 is fixed by YAG laser welding.

Lastly, an optical fiber 8 is positioned at an end of the second lens holding member 21 such that the maximum amount of laser light is coupled to the optical fiber 8, and then fixed. To fix the optical fiber 8, a ferrule 23 holding the tip of the optical fiber 8 is welded by YAG laser welding to the end of the second lens holding member 21 through a slide ring 22.

According to the third embodiment, the depolarizing element 110 is placed between the semiconductor laser device 2 and the optical fiber 8, and therefore depolarized laser light is obtained from the optical fiber 8. In addition, the depolarizing element is placed between the first lens and the second lens to make it easy to design an optical system from the semiconductor laser device to the optical fiber.

Furthermore, the depolarizing element 110 and the first lens 4 are integrated into one before alignment, thus facilitating the alignment of the depolarizing element 110 and the first lens 4 and shortening the period of time required for the alignment.

In the above embodiment, the holder member 111 holding the depolarizing element 110 and the first lens holding member 13 holding the first lens 4 are prepared separately and then integrated into one. Alternatively, the depolarizing element 110 and the first lens 4 may be fixed together to a single holder in advance.

Fourth Embodiment

Figure 5:
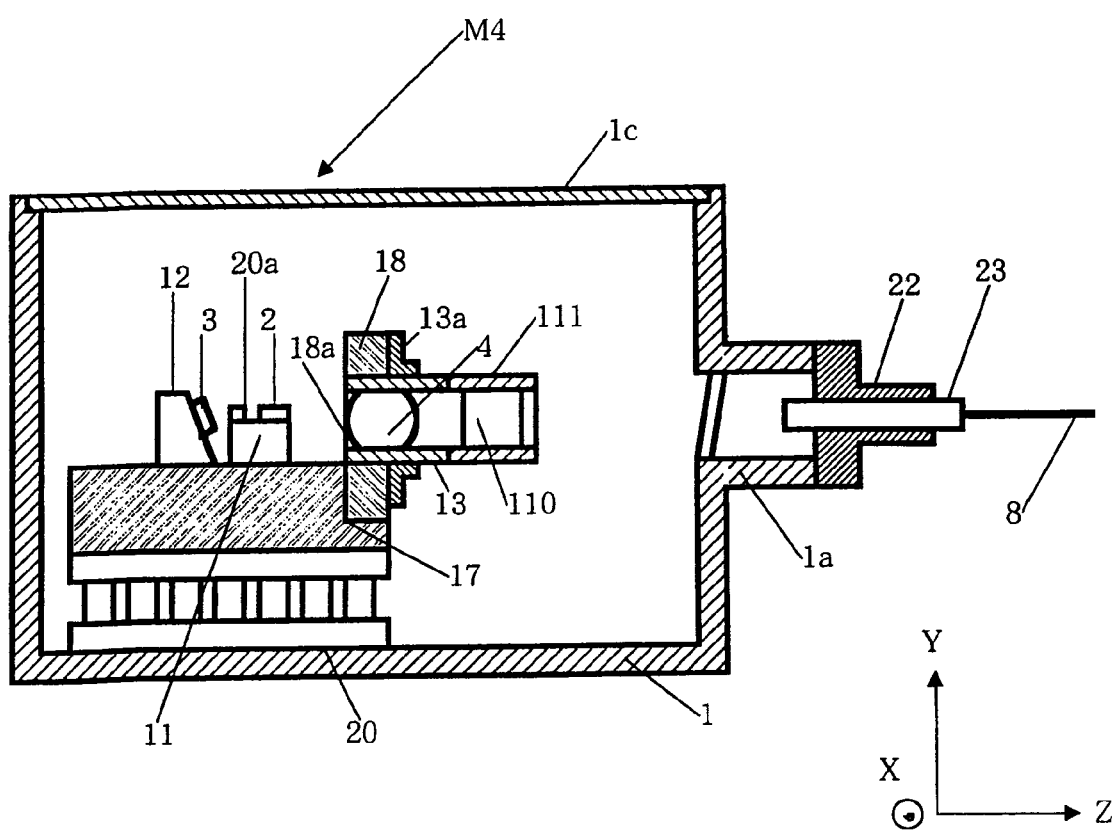
FIG. 5 is a side sectional view showing a configuration of a semiconductor laser module in accordance with a fourth embodiment of the present invention.

FIG. 5 is a side sectional view showing a structure of a semiconductor laser module M4 according to a fourth embodiment of the present invention.

As shown in FIG. 5, the semiconductor laser module M4 according to the fourth embodiment of the present invention is characterized in that a condenser for optically coupling laser light to the optical fiber 8 is used as the first lens 4, thus making the second lens 16 unnecessary. The fourth embodiment has a similar structure to the third embodiment except for that character.

According to the fourth embodiment, a condenser for optically coupling laser light to the optical fiber 8 is used as the first lens 4 to eliminate the need for the second lens 16. Therefore, the semiconductor laser module M4 has fewer parts, a simpler structure, and is less costly.

Fifth Embodiment

Figure 6:
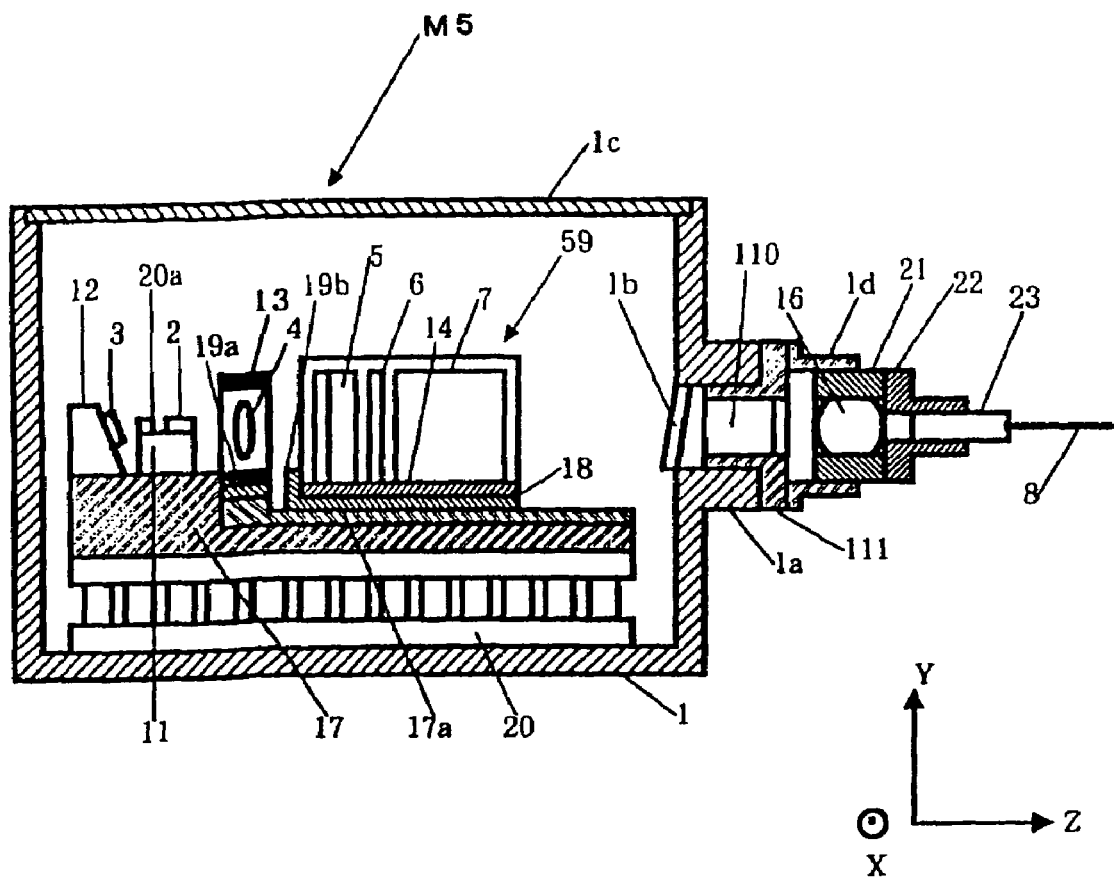
FIG. 6(A) is a side sectional view showing a configuration of a semiconductor laser module in accordance with a fifth embodiment of the present invention.
FIG. 6(B) is a side view showing a state where a semiconductor laser device is fixed onto a heat sink.
Figure 6:
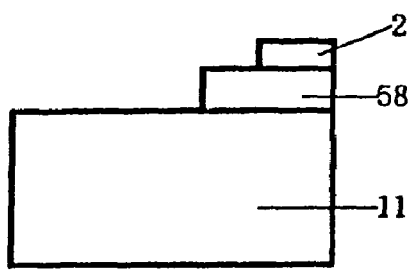
Figure 7:
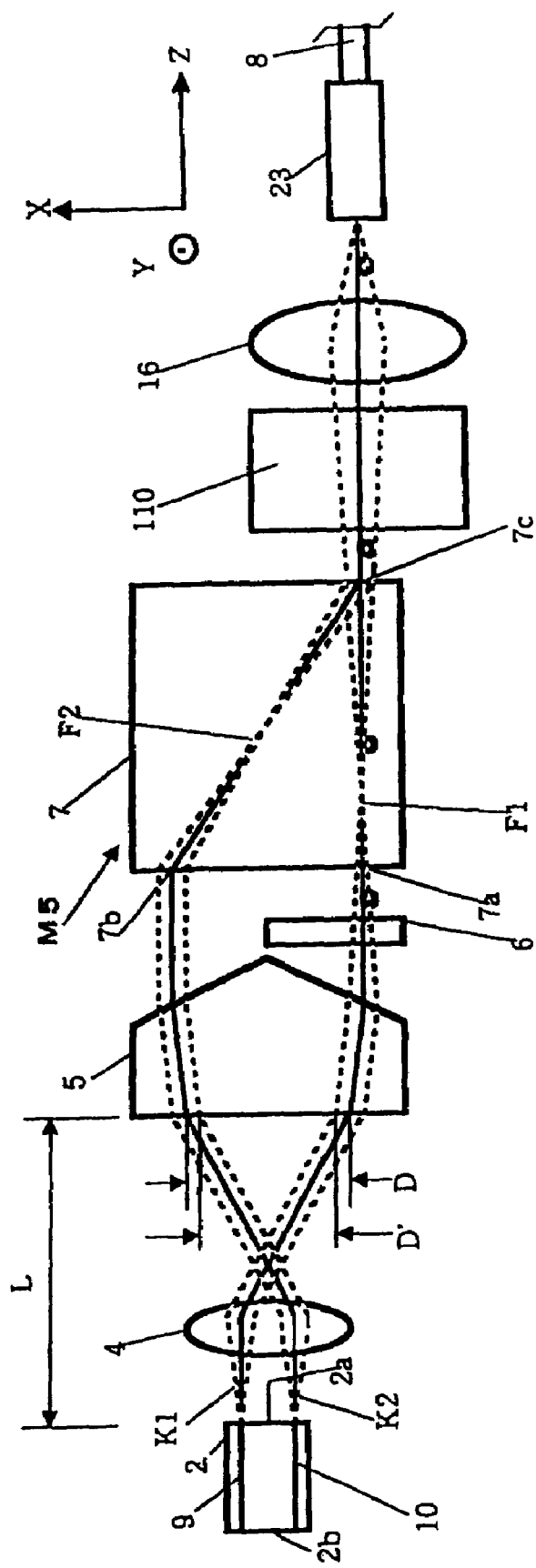
FIG. 7 is an explanatory diagram schematically showing a configuration of an optical system used in the semiconductor laser module of the fifth embodiment of the present invention.

FIG. 6 are side sectional views showing a structure of a semiconductor laser module M5 according to a fifth embodiment of the present invention. FIG. 7 is an explanatory view for schematic illustration of the structure of an optical system in the semiconductor laser module according to the fifth embodiment of the present invention.

As shown in FIG. 6, the semiconductor laser module M5 according to the fifth embodiment of the present invention has: a package 1 with the interior sealed air tight; a semiconductor laser device 2 provided in the package 1 to emit laser light; a photodiode (light receiving element) 3; a first lens 4; a prism 5; a half-wave plate (polarization rotator) 6; a PBC (Polarization Beam Combiner) 7 to serve as light synthesizing means; a depolarizing element 10; and an optical fiber 8.

The semiconductor laser device 2 has, as shown in FIG. 7, a first stripe 9 and a second stripe 10, which are formed on the same plane and run in the longitudinal direction parallel to each other across a gap. First laser beam K1 and second laser beam K2 are emitted from an end face of the first stripe 9 and from an end face of the second stripe 10, respectively. K1 and K2 in FIG. 7 show tracks of the center of laser beams respectively for a shift in angle of optical parts (0.1° or less). However, there is more tolerance for the angle shift in a condenser system where laser light is converged for propagation. For that reason, using the first lens 4 as a converging lens increases the tolerance for the shape, position, and angle adjustment of optical parts and is preferable.

The use of the first lens 4 as a converging lens also reduces the spot diameter of laser light propagated, which makes it possible to reduce in size of optical parts used.

As shown in FIG. 6(A), the first lens 4 is held by a first lens holding member 13. The first lens 4 is preferably positioned as shown in FIG. 7, in which the optical axis of the first laser beam K1 emitted from the first stripe 9 and the optical axis of the second laser beam K2 emitted from the second stripe 10 are approximately symmetrical with respect to the central axis of the first lens 4. In this way, both the first laser beam K1 and the second laser beam K2 pass the vicinity of the central axis where the aberration is small. Accordingly, the wave front of the laser light is disturbed less and the laser light can be optically coupled to the optical fiber 8 with enhanced efficiency. As a result, the semiconductor laser module M5 can obtain higher optical output. In order to reduce the influence of spherical aberration and obtain high coupling efficiency, it is desirable to employ an aspherical lens as the first lens 4.

The prism 5 is placed between the first lens 4 and the PBC 7 to receive and correct the light paths of the first laser beam K1 and the second laser beam K2 so that the optical axes of the laser beam K1 and K2 are approximately parallel to each other when the laser beams exit the prism 5. The prism 5 is formed of optical glass such as BK7 (borosilicate crown glass). The optical axes of the first and second laser beam K1 and K2, which have been unparallel to each other during propagation from the first lens 4, are made parallel to each other by refraction of the prism 5. This facilitates manufacture of the PBC 7, which is placed behind the prism 5, and reduces the PBC 7 in size, thus making size reduction of the semiconductor laser module M5 possible.

Figure 8A:
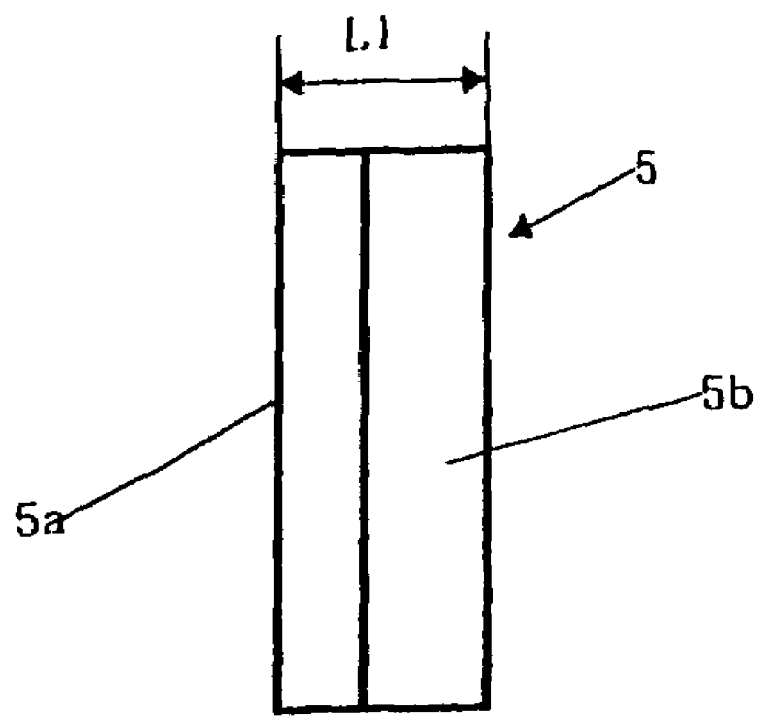
FIG. 8(A) is a side view showing a shape of a prism.
Figure 8B:
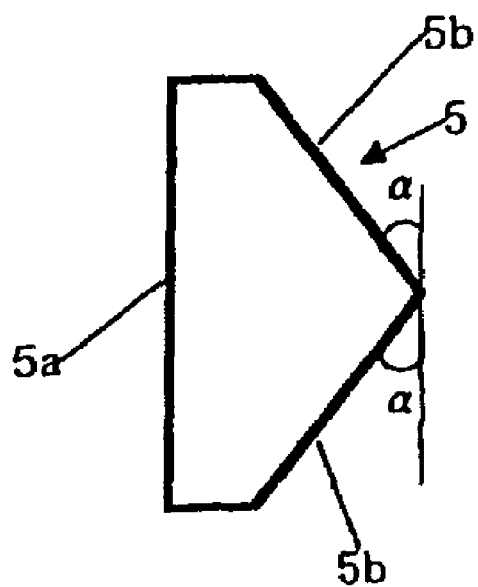
FIG. 8(B) is a plan view thereof.

FIG. 8(A) is a side view showing a structure of the prism 5, and FIG. 8(B) is a plan view of the prism 5. As shown in FIG. 8, the prism 5 has a level incident surface 5a and exit surfaces 5b inclined at a given angle α. For instance, when the prism 5 is formed of BK7, the gap between the stripes of the semiconductor laser device is 40 μm, and the first lens has a focal length of 0.7 mm, an entire length L1 of the prism 5 is about 1.0 mm, and the angle α is set to 3.2°±0.1°.

The half-wave plate 6 is, as shown in FIG. 7, a polarization rotator which receives the first laser beam K1 alone out of the first laser beam K1 and the second laser beam K2 that have passed through the prism 5 to rotate the polarization direction of the first laser beam K1 by 90 degrees. The first and second laser beam K1 and K2 have been distanced from each other by the first lens 4 far enough to facilitate arrangement of the half-wave plate 6.

The PBC 7 has a first input portion 7a where the first laser beam K1 enters, a second input portion 7b where the second laser beam K2 enters, and an output portion 7c from which a laser light obtained by combining the first laser beam K1 incident on the first input portion 7a and the second laser beam K2 incident on the second input portion 7b is outputted. PBC 7 is, for example, a birefringent element for propagating the first laser beam K1 as an ordinary ray and the second laser beam K2 as an extraordinary ray to the output portion 7c. When the PBC 7 is the birefringent element, for example, $TiO_2$ (rutile) is used to form the PBC 7.

This embodiment uses a polarized wave synthesizing module 59, which is obtained by fixing the half-wave plate 6 and the PBC 7 to the same holder member that is denoted by 14. FIG. 9(A) shows the polarized wave synthesizing module 59 in section cut along the line A-A of FIG. 9(B). FIG. 9(B) is a side sectional view of the polarized wave synthesizing module 59, FIG. 9(C) is a frontal view thereof, and FIG. 9(D) is a perspective view of the polarized wave synthesizing module 59 and a second supporting member 19b. As shown in FIG. 9, the holder member 14 of the polarized wave synthesizing module 59 is formed from a material suitable for YAG laser welding (for example, SUS 403 or 304), has an entire length L2 set to about 7.0 mm, and is shaped overall like a cylinder with a central axis C1. A housing portion 14a is formed in the interior of the holder member 14. The prism 5, the half-wave plate 6, and the PBC 7 are fixed to the housing portion 14a. The top and bottom of the holder member 14 are level.

The polarized wave synthesizing module 59 is, as shown in FIG. 9(D), fit between two erect walls of the second supporting member 19b, which is roughly shaped in section like the letter U. The polarized wave synthesizing module 59 is positioned between the erect walls in the Y direction, the Z direction, the θ (angle about the Z axis) direction, and the (angle about the X axis) direction. Then, while positioning the polarized wave synthesizing module 59 and the second supporting member 19b in the X direction and the 4 (angle about the Y axis) direction, the polarized wave synthesizing module 59 is fixed by YAG laser welding to the second base 18 through the second supporting member 19b.

With the holder member 14 making these optical parts unitary, how much the laser beam K1 and K2 overlap each other at the output portion 7c of the PBC 7 can easily be adjusted by simply moving the holder member 14 through the second supporting member 19b.

Exit laser light from the PBC 7 usually has low degree of polarization (DOP) because of polarization synthesis. In some cases, however, polarization synthesis by the PBC 7 alone is not enough to obtain a desired low degree of polarization if there is a difference between two laser beams in intensity, spreading angle, optical length of the propagation laser beam path, amount of attenuation experienced along the propagation laser beam path, or the like. However, this is not the case for the fifth embodiment, and the fifth embodiment can obtain low degree of polarization without fail because depolarization is performed by the depolarizing element 110 placed on the side of the output portion 7c of the PBC 7.

The depolarizing element 110 is made from a birefringence material such as rutile or $YVO_4$ as in the first through fourth embodiment.

Figure 10:
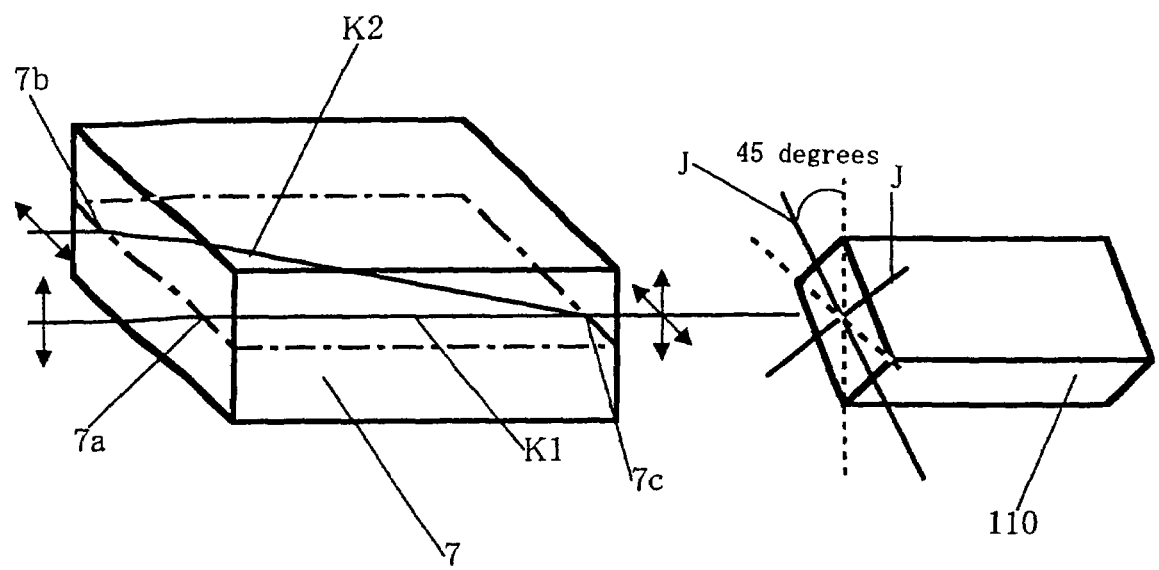
FIG. 10 is a schematic diagram showing a relation between the polarization direction of two laser beams combined by the PBC and the principal axis of the depolarizing element.

FIG. 10 is a schematic diagram showing a relation between the polarization direction of two laser beams combined by the PBC 7 and the principal axis (optical axis) of the depolarizing element 110. As shown in FIG. 10, the depolarizing element 110 is arranged along a laser beam path of laser beam outputted from the PBC 7 such that a principal axis J forms an angle of about 45 degrees with respect to the polarization direction (indicated by the dashed line in FIG. 10) of each of two incident laser beams. The length of the depolarizing element 110 is determined by the polarization dispersion of the birefringent material and the width of the envelope curve of the wavelength spectrum of incident laser beam. If a beam has a thin spectrum, the depolarizing element 110 is long, whereas the depolarizing element 110 is short if a beam has a thick spectrum. Specifically, when formed of rutile, the depolarizing element 110 is about 5 mm in length if a Fabry-Perot laser having a spectrum width of 5 to 8 nm is used, and is about 10 mm if the semiconductor laser module is provided with a diffraction grating, which will be described later, to reduce the spectrum width to 1 nm or less.

A second lens 16 is placed between the depolarizing element 110 and the optical fiber 8 to optically couple, to the optical fiber 8, laser light that exit the depolarizing element 110. In this embodiment, the first lens 4 is positioned such that the first laser beam K1 and the second laser beam K2 focus on focal points (F1 and F2) between the first lens 4 and the second lens 16. As a result, the laser beam spot size is reduced between the first lens 4 and the second lens 16. Accordingly, overlapping of the laser beams is avoided. This shortens a propagation distance L (see FIG. 7) necessary to obtain a separation width D' between the first laser beam K1 and the second laser beam K2 which is wide enough to insert the half-wave plate 6 on the beam path of the laser beam K1 alone. The length of the semiconductor laser module M5 can therefore be cut short in the optical axis direction. This improves the reliability of the semiconductor laser module M5 in which optical coupling between the semiconductor laser device 2 and the optical fiber 8 shows excellent stability with period of time in, for example, a high temperature environment.

In addition, optical parts used can be reduced in size because the laser light spot diameter can be reduced between the first lens 4 and the second lens 16.

As shown in FIG. 6, the chip carrier 11 with the semiconductor laser device 2 fixed thereto and the photodiode carrier 12 with the photodiode 3 fixed thereto are fixed by soldering onto the first base 17 that is roughly shaped in section like the letter L. The first base 17 is preferably formed from a CuW-based alloy or the like in order to enhance the ability to dissipate heat generated by the semiconductor laser device 2.

A first lens holding member 13, to which the first lens 4 is fixed, and the polarized wave synthesizing module 59, in which the prism 5, the half-wave plate 6, and the PBC 7 are fixed to the holder member 14, are fixed by laser welding onto a second base 18 through a first supporting member 19a and the second supporting member 19b, respectively. The second base 18 is made of stainless steel and is fixed in advance onto the first base 17 by silver alloy brazing.

The package 1 has in its side a flange portion 1a, where a window portion 1b is provided to receive light that has passed through the PBC 7. The depolarizing element 110 is placed at an end of the flange portion 1a.

The depolarizing element 110 is held in a holder member 111 as shown in FIG. 6. The holder member 111 is fixed to the end of the flange portion 1a that is formed in the side of the package 1.

When positioning the depolarizing element 110, the degree of polarization of laser light that exits the depolarizing element 110 is measured while the holder member 111 is rotated about the central axis of the flange portion 1a at the end of the flange portion 1a. At a position where the minimum degree of polarization is measured, the holder member 111 is fixed to the end of the flange portion 1a by YAG laser welding.

A second lens holding member 21 that holds the second lens 16 for collecting laser light is fixed to an end of the holder member 111. A ferrule 23 holding the optical fiber 8 through a metal slide ring 22 is fixed to an end of the second lens holding member 21 by YAG laser welding.

Described next is the operation of the semiconductor laser module M5 according to the fifth embodiment of the present invention.

As shown in FIG. 7, the first laser beam K1 and the second laser beam K2, which are emitted from the front side end face 2a of the first stripe 9 and the second stripe 10 of the semiconductor laser device 2, respectively, pass the first lens 4, intersect with each other, and then are put well apart from each other before entering the prism 5. Upon entering the prism 5, the first laser beam K1 and the second laser beam K2 has a gap D of about 460 μm therebetween. The optical axes of the first laser beam K1 and the second laser beam K2 are made parallel to each other by the prism 5 and the gap between the two laser beams after exiting the prism 5 is about 500 μm. The first laser beam K1 enters the half-wave plate 6, and the polarization direction of K1 is rotated by 90 degrees before entering the first input portion 7a of the PBC 7. The second laser beam K2 enters the second input portion 7b of the PBC 7.

In the PBC 7, the first laser beam K1 incident on the first input portion 7a and the second laser beam K2 incident on the second input portion 7b are combined, and the synthesized laser beams exits the PBC 7 from the output portion 7c.

The laser light that has exited the PBC 7 is well depolarized by the depolarizing element 110 and then collected by the second lens 16 to enter an end face of the optical fiber 8 and propagate.

In the semiconductor laser module M5 according to the fifth embodiment of the present invention, the first and second stripes 9 and 10, which are formed in one semiconductor laser device 2 across as narrow a gap as 100 μm or less from each other, emit the first laser beam K1 and the second laser beam K2 that have the same polarization direction. The first laser beam K1 and the second laser beam K2 are well separated from each other by the first lens 4, and then the half-wave plate 6 rotates the polarization direction of the first laser beam K1 by 90 degrees. This makes the polarization direction of the laser beam K1 orthogonal to the polarization direction of the laser beam 2. The PBC 7 combines the thus polarized first laser beam K1 and second laser beam K2.

Usually, laser beams obtained by polarization synthesis in this manner has low degree of polarization. In some cases, however, polarization synthesis by the PBC 7 alone is not enough to obtain a desired low degree of polarization if there is a difference between two laser beams in intensity, spreading angle, optical length of the propagation beam path, amount of attenuation experienced along the propagation beam path, or the like. The semiconductor laser module of this embodiment places the depolarizing element 110 on the exit side of the PBC 7 and therefore can satisfactorily lower the degree of polarization by passing synthesized laser light through the depolarizing element 110 when the degree of polarization of the synthesized laser light is not low enough. Accordingly, the semiconductor laser module of this embodiment is suitable as a pumping light source of a Raman amplifier in which polarization dependency of the amplification gain has to be low. In addition, this embodiment can avoid an increase in polarization which is caused by efficiency imbalance in coupling to the optical fiber 8 laser beams emitted from the two stripes 9 and 10, or degradation of one of the stripes, or other changes resulting from long term use.

The semiconductor laser module M5 of this embodiment uses one semiconductor laser device 2 having two stripes each of which emits one laser beam and the single first lens 4 that separates the laser beam K1 and K2 from each other. This shortens the period of time required to position the semiconductor laser device 2 and the first lens 4. As a result, the semiconductor laser module M1 can be manufactured in a shorter time.

In addition, since one semiconductor laser device 2 is used, a cooling device 20 such as a Peltier module for cooling heat that is generated by the semiconductor laser device 2 can have a small size and the power consumption can be reduced.

A description given next is about a method of manufacturing the semiconductor laser module M5 according to the fifth embodiment of the present invention.

First, the chip carrier 11 to which the semiconductor laser device 2 is fixed and the photodiode carrier 12 to which the photodiode 3 is fixed, are fixed by soldering onto the first base 17.

Next, the first lens 4 is fixed onto the second base 18 in a way that aligns the lens 4. In this aligning step of the first lens 4, the semiconductor laser device 2 is supplied with the electric current and emits the first and second laser beam K1 and K2 from both of the first and second stripes 9 and 10 of the semiconductor laser device 2. Then, after setting this beam emitting direction as a fiducial direction, the first lens 4 is inserted and positioned in the X-, Y- and Z-axis directions.

Figure 12A:
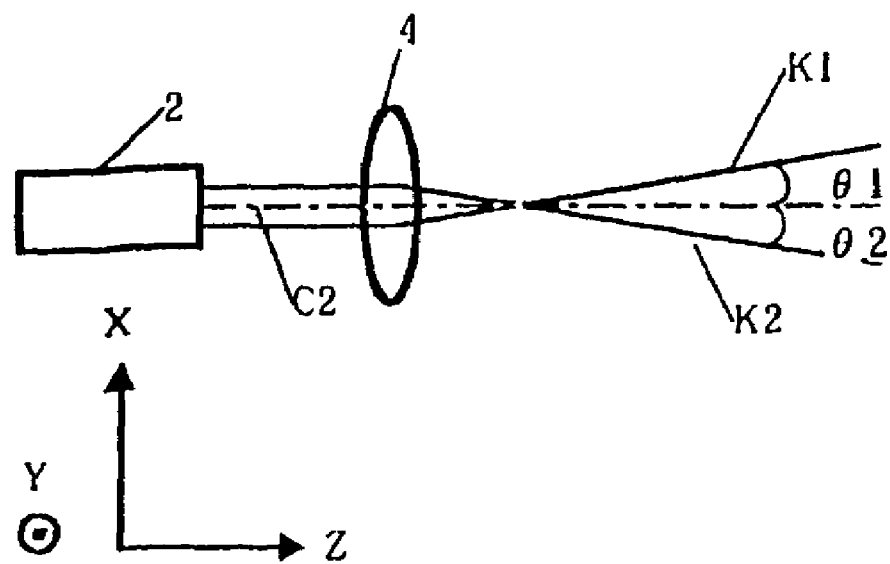
FIGS. 12(A) and (B) are explanatory diagrams showing an alignment process of the first lens of the fifth embodiment of the present invention.
Figure 12B:
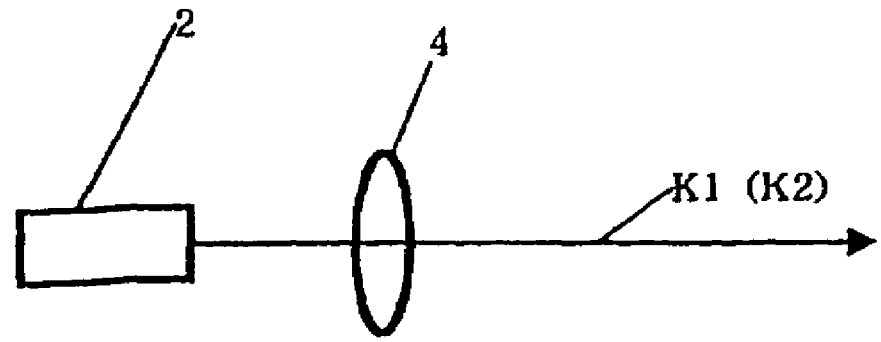

FIG. 12 are explanatory diagrams showing the aligning step of the first lens 4. The first lens 4 is, as shown in FIG. 12(A), positioned in the X-axis direction so that an angle 01 made between the fiducial direction (a central axis C2) set in the way described above and the first laser beam K1 is equal to an angle 82 made between the central axis C2 and the second laser beam K2. The first lens 4 is, as shown in FIG. 12(B), positioned in the Y-axis direction so that the first and second laser beam K1 and K2 travel through the center of the first lens 4. Further, the first lens 4 is positioned in the Z-axis direction so that a spot size is minimized at a predetermined position between the first lens 4 and the second lens 16. The first lens holding member 13, which holds the first lens 4 positioned in the aligning step described above, is fixed by the YAG laser welding onto the second base 18 through the first support member 19a.

Then, the polarized wave synthesizing module 59, in which the prism 5, the half-wave plate 6, and the PBC 7 are integrated into one, is aligned and fixed onto the second base 18.

In this step of aligning the polarized wave synthesizing module 59, a dummy fiber (fiber with a lens) for positioning is placed at a position where the fiber can receive synthesized beams from the output portion 7c of the PBC 7. The holder member 14 is positioned in the X-axis, Y-axis, and Z-axis directions and in the θ (angle about the Z axis) direction, the θ (angle about the Y axis) direction, and the Ψ (angle about the X axis) direction in a manner that gives laser light coupled to the dummy fiber the maximum intensity (see FIG. 9). When positioning the holder member 14 in the Y, Z, θ, and Ψ directions, the holder member 14 is fit between the two erect walls of the second supporting member 19b that is roughly shaped in section like the letter U as shown in FIG. 9(D). Then the holder member 14 is moved in the X-axis and φ directions together with the second supporting member 19b for positioning.

At the position set in the above-described aligning step, the second supporting member 19b is welded to the second base 18 by YAG laser welding as shown in FIG. 9(D).

Then, the holder member 14 is welded by YAG laser welding onto the erect walls of the second supporting member 19b. In this way, the holder member 14 is fixed onto the second base 18.

Subsequently, the first base 17 is fixed by soldering onto the cooling device 20 fixed beforehand onto a bottom plate of the package 1.

Then, the semiconductor laser device 2 and the monitor photodiode 3 is electrically connected to a lead (not shown in the drawing) of the package 1 through a gold wire (not shown in the drawing).

Next, a lid 1c is placed on the package 1 in an inert gas (for example, $N_2$ or Xe) atmosphere, and the package is sealed airtightly by resistance welding of the perimeter of the lid.

Next, the depolarizing element 110 is aligned and fixed to the flange portion 1a of the package 1. In this step of aligning the depolarizing element 110, a polarization measurement device is placed in a position where the polarization measurement device can receive light exiting the depolarizing element 110. The polarization measurement device measures the degree of polarization of the exiting light while rotating the holder member 111 about the central axis (Z axis in FIG. 6) of the flange portion 1a over an end face of the flange portion 1a to find a position where the minimum degree of polarization is obtained.

At the position found in the above-described aligning step, the holder member 111 is fixed to the end face of the flange portion 1a by YAG laser welding.

Next, the second lens 16 is aligned within the XY plane in the Z-axis direction and fixed to an end face of the holder member 111. In this step, the second lens holding member 21 is brought into contact with the end face of the holder member 111 to be positioned within the XY plane in a manner that makes the optical axis of exit laser light from the second lens 16 parallel to the central axis of the flange portion 1a. Then, while monitoring the spreading angle of exit laser light from the second lens 16, the second lens holding member 21 is moved in the Z-axis direction to position the second lens holding member 21 in the Z-axis direction such that the spreading angle is approximately equal to a light receiving angle (NA) of the optical fiber 8. At the position thus set, the second lens holding member 21 and the holder member 111 are welded by YAG laser welding through a slide ring 1d.

Lastly, the optical fiber 8 is aligned and fixed. In this step, while a power meter is connected to the tail end of the optical fiber 8 and the ferrule 23 is inserted in the slide ring 22, the ferrule 23 is moved within the plane perpendicular to the optical axis of the optical fiber 8 (within the XY plane) in the direction of the optical axis of the optical fiber 8 (the Z direction) to adjust the position such that the maximum light output is measured by the power meter.

After positioning the optical fiber 8 in this manner is finished, the ferrule 23 is fixed by YAG laser welding at the set position inside the slide ring 22. Then, the slide ring 22 and the second lens holding member 21 are fixed at the interface between the two by YAG laser welding. This completes assembly of the semiconductor laser module M5.

Figure 11A:
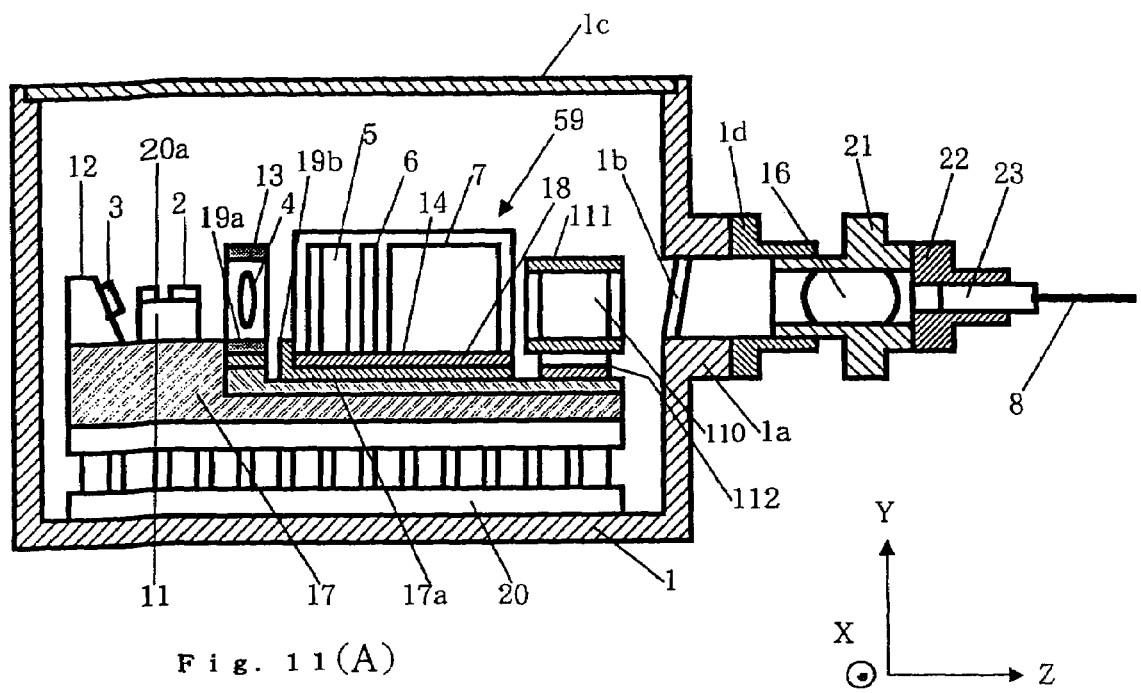
FIG. 11(A) is a side sectional view of a modification example of the fifth embodiment of the present invention.
Figure 11B:
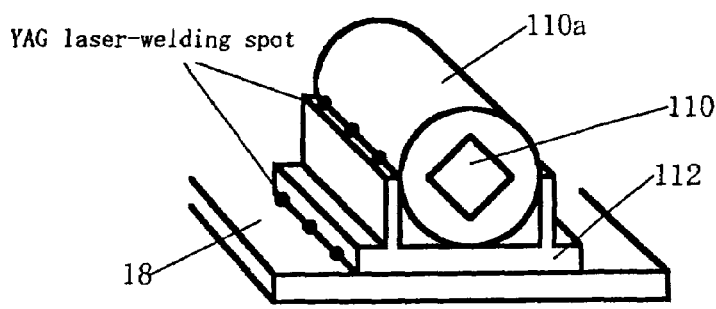
FIG. 11(B) is a perspective view showing a third supporting member that supports the depolarizing element.

FIG. 11(A) is a side sectional view of a modification example of the fifth embodiment of the present invention, and FIG. 11(B) is a perspective view showing a third supporting member 112 that supports the depolarizing element.

As shown in FIGS. 11(A) and 11(B), the modification example of the fifth embodiment is similar to the first embodiment in that the holder member 111 holding the depolarizing element 110 is fixed by YAG laser welding while positioned between two erect walls of the third supporting member 112 fixed onto the second base 18.

According to this modification example, the cooling device 20 performs the temperature adjustment to keep the temperature of the depolarizing element 110 constant as well as the PBC 7 as in the first embodiment. Therefore a change in characteristic due to a change in temperature of the depolarizing element 110 can be avoided, and stable depolarization is obtained.

Figure 14:
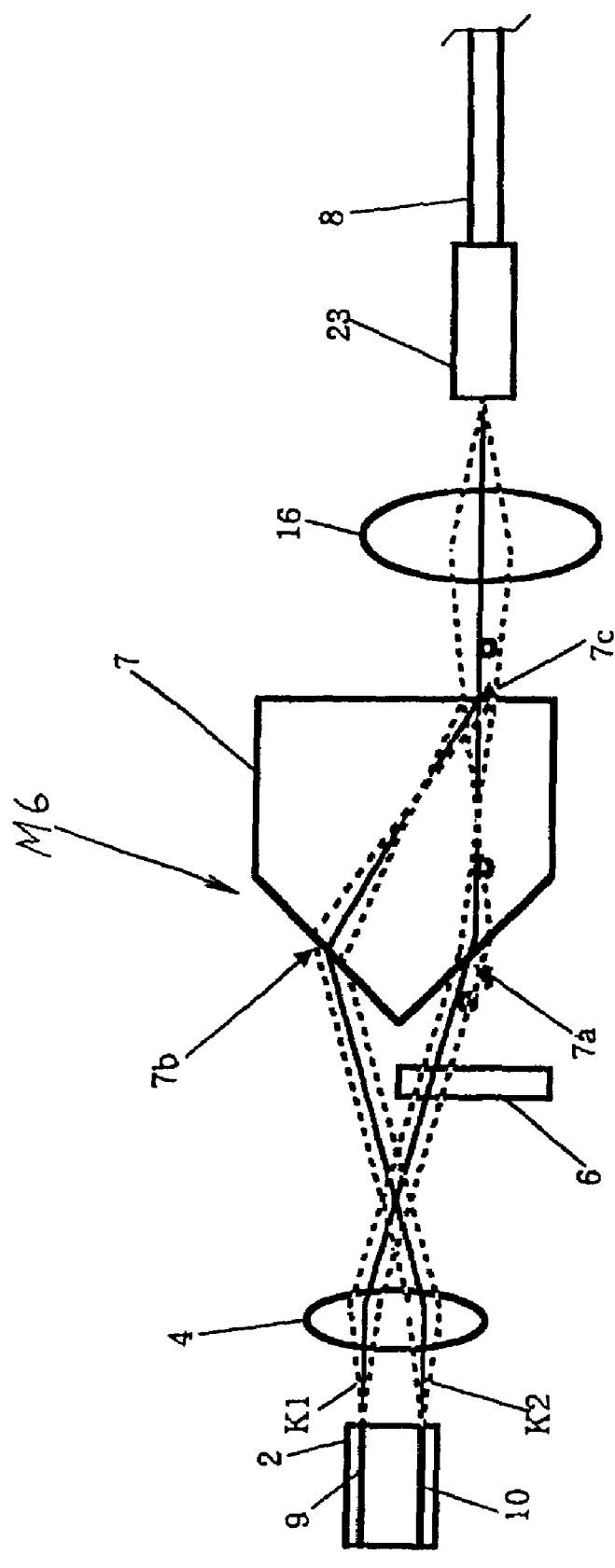
FIG. 14 is an explanatory diagram schematically showing a configuration of a modified example of an optical system used in the semiconductor laser module in accordance with the fifth embodiment of the present invention.

A semiconductor laser module of the present invention is not limited to the structure described above and, for instance, may be like a semiconductor laser module M6 shown in FIG. 14. In FIG. 14, the first laser beam K1 and the second laser beam K2 which are not parallel to each other enter the PBC 7, and the incident faces of the PBC 7 are slanted forming a wedge-like shape so that the first laser beam K1 as an ordinary ray is propagated in the axis line direction of the optical fiber 8 whereas the second laser beam K2 as an extraordinary ray exits the output portion 7c of the PBC 7 in the axis line direction of the optical fiber 8 together with the first laser beam K1.

Figure 15:
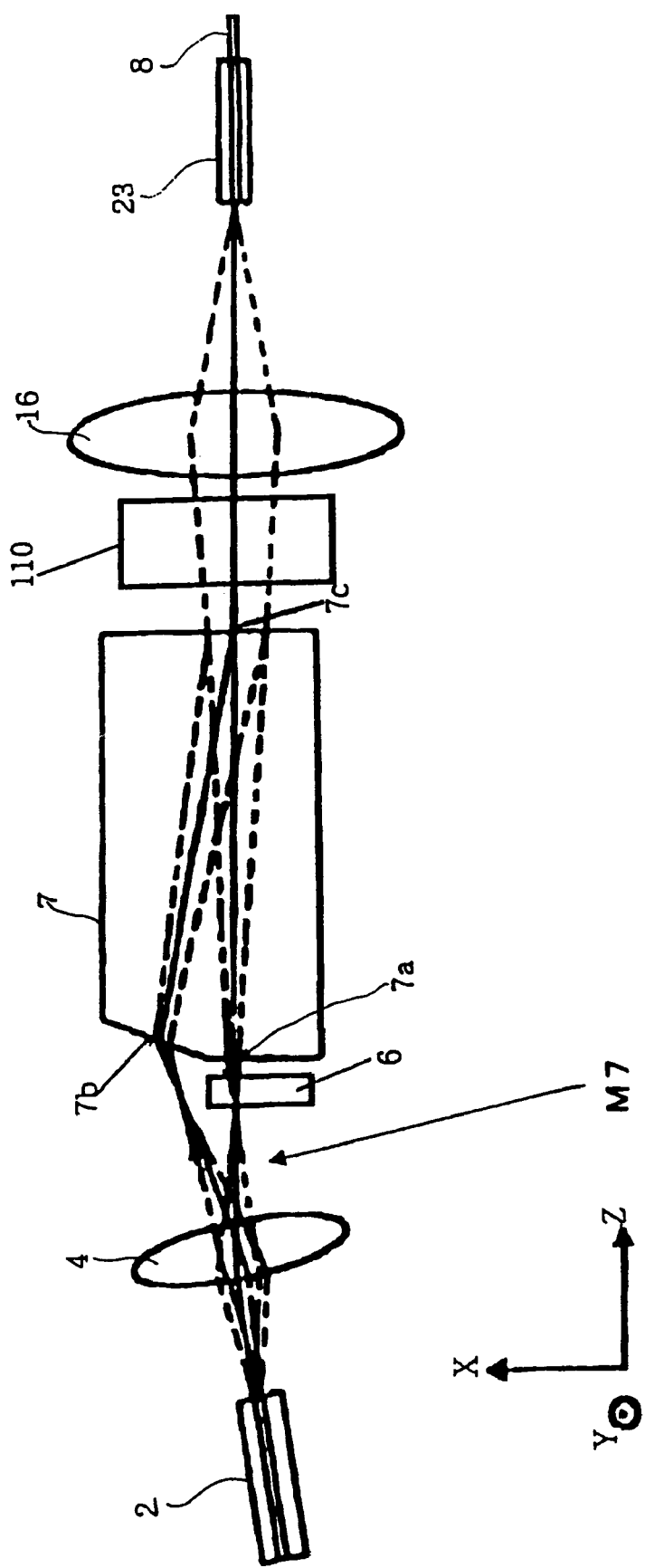
FIG. 15 is an explanatory diagram schematically showing a configuration of a modified example of an optical system used in the semiconductor laser module in accordance with the fifth embodiment of the present invention.

Also, a semiconductor laser module of the present invention may be like a semiconductor laser module M7 shown in FIG. 15. In FIG. 15, the semiconductor laser device 2 and the first lens 4 are slanted to be placed at a given angle with respect to the axis line of the optical fiber 8 and the second input portion 7b of the PBC 7 is slanted with respect to the first input portion 7a so that the first laser beam K1 is propagated in the axis line direction of the optical fiber 8 after exiting the first lens 4.

Figure 16:
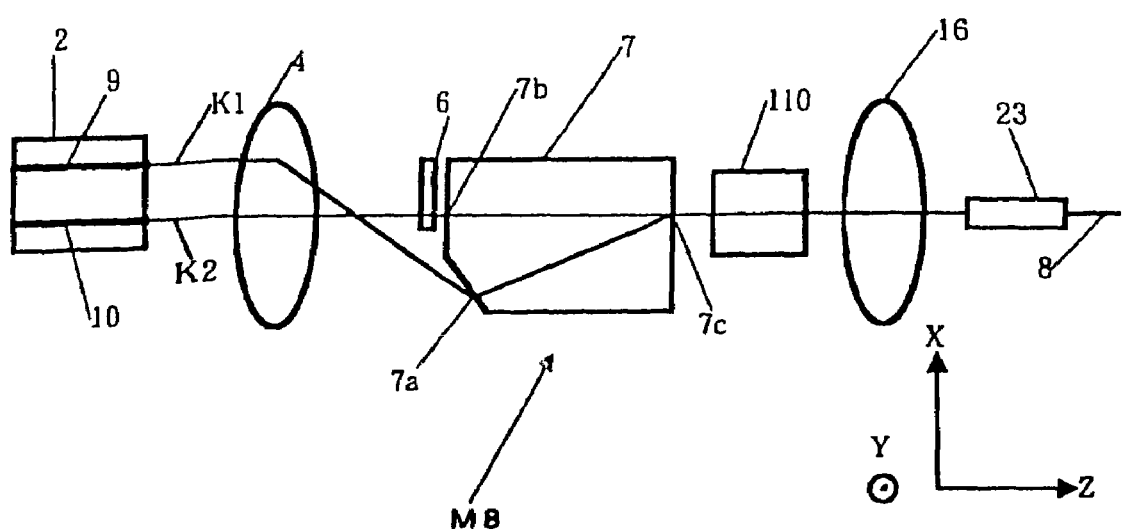
FIG. 16 is an explanatory diagram schematically showing a configuration of a modified example of an optical system used in the semiconductor laser module in accordance with the fifth embodiment of the present invention.

Also, a semiconductor laser module of the present invention may be like a semiconductor laser module M8 shown in FIG. 16. In FIG. 16, the first lens 4 is arranged such that the second laser beam K2 is transmitted through the first lens at approximately the center of the first lens, and the first input portion 7a is slanted with respect to the second input portion 7b so that the second laser beam K2 is propagated in the axis line of the optical fiber 8 and the first laser beam K1 exits the output portion 7c in parallel to the axis line direction of the optical fiber 8 together with the second laser beam K2.

In the semiconductor laser modules M6 through M8 structured as described above, there is no need to place the prism 5 between the half-wave plate 6 and the first lens 4. This provides a simpler structure and the length in the optical axis direction of the semiconductor laser module can be shortened. Accordingly, the laser light output characteristic is less affected by warping of the package in a high temperature environment.

Figure 17:
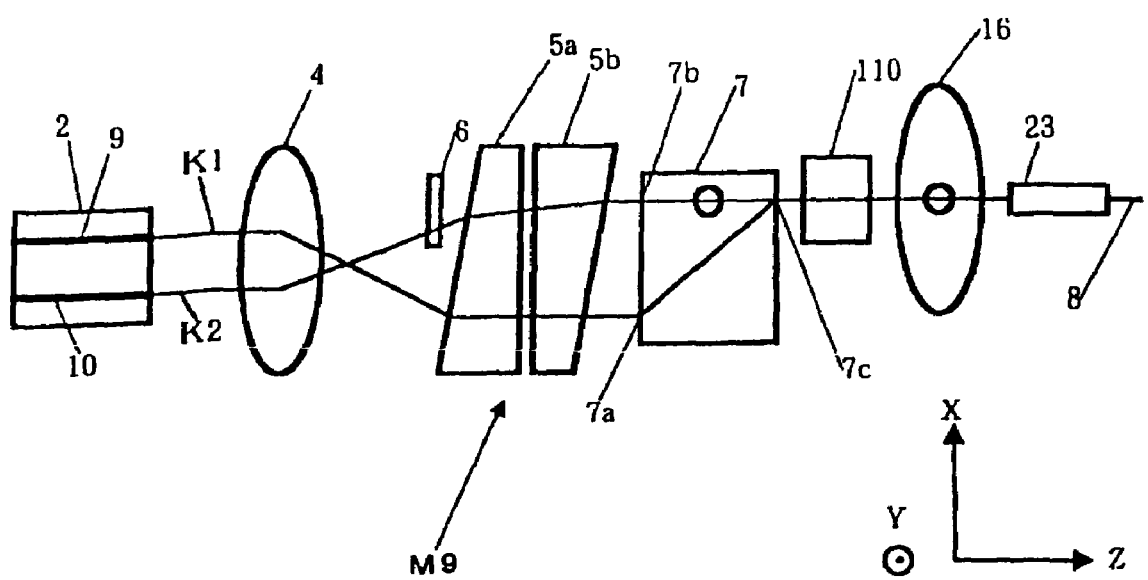
FIG. 17 is an explanatory diagram schematically showing a configuration of a modified example of an optical system used in the semiconductor laser module in accordance with the fifth embodiment of the present invention.

A semiconductor laser module of the present invention may also be like a semiconductor laser module M9 shown in FIG. 17. In FIG. 17, plural wedge-shaped prisms 5 (two prisms 5a and 5b in FIG. 17) are placed in the optical axis direction to make the two laser beams K1 and K2 parallel to each other after the laser beams exit the first lens 4. In this embodiment, the two laser beams K1 and K2 can be made parallel to each other with precision.

Figure 18A:
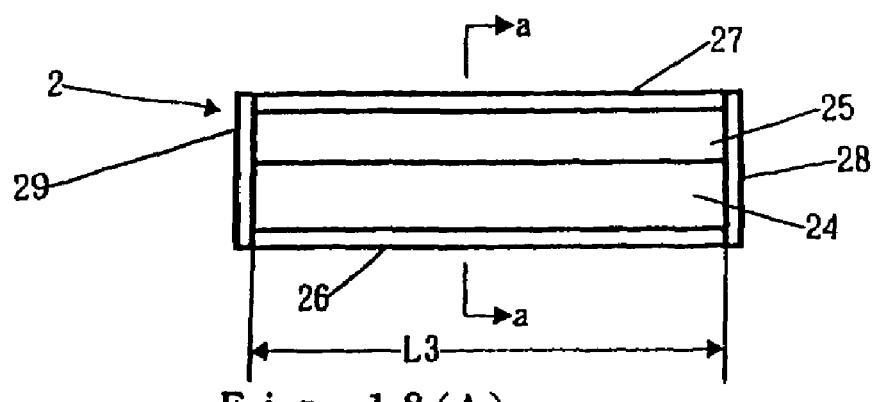
Figure 18B:
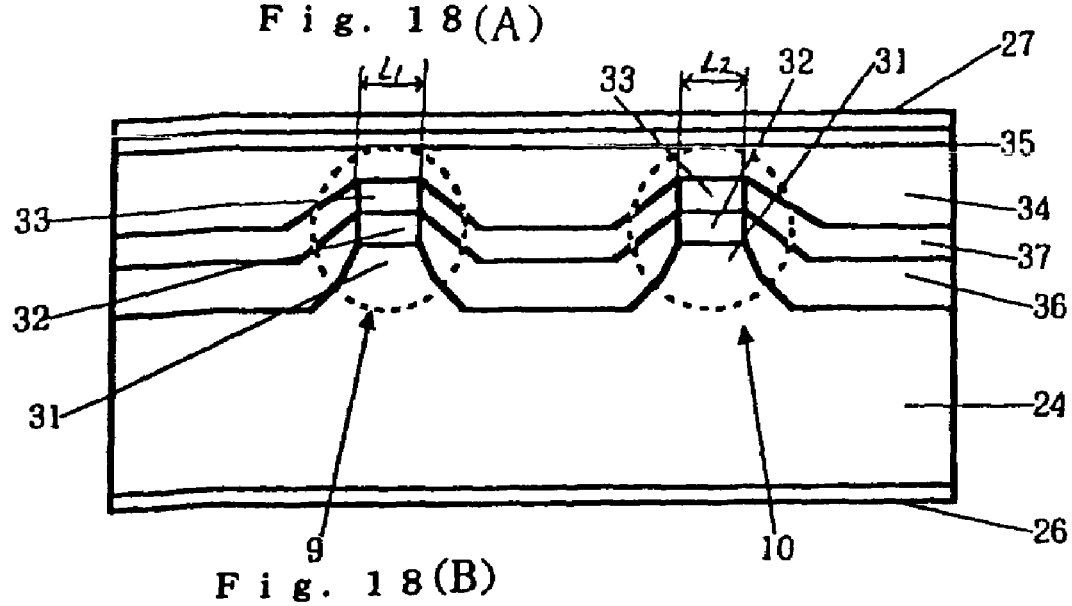
FIG. 18(B) is a cross sectional diagram taken along the line a-a in FIG. 18(A)
Figure 19:
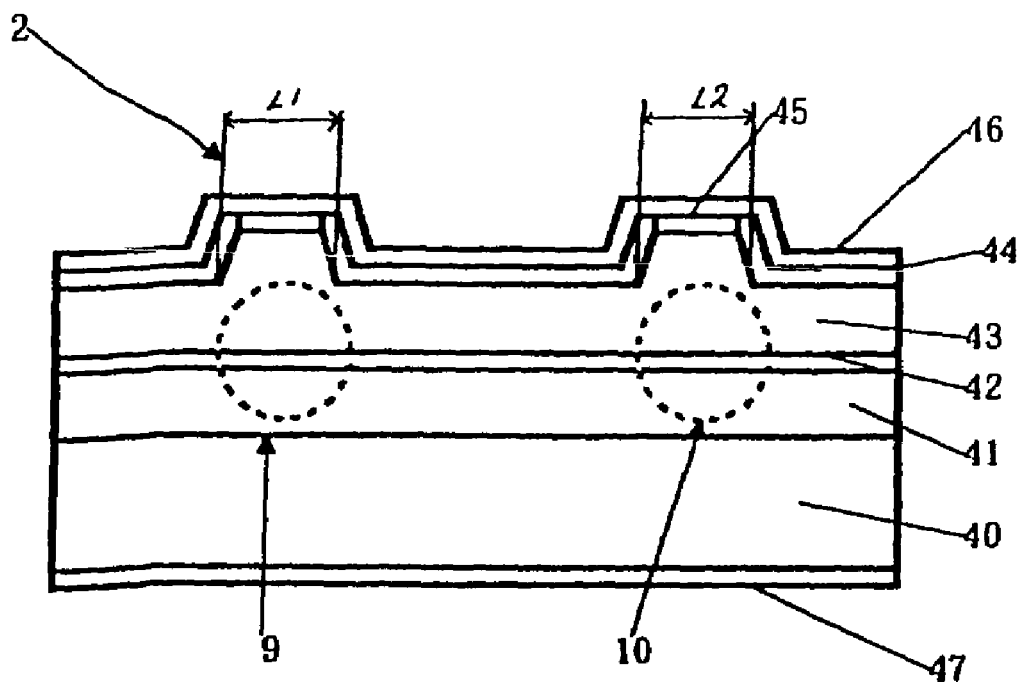
FIG. 19 is an explanatory diagram showing another example of the semiconductor laser device in accordance with the fifth embodiment of the present invention.

Now, a description is given on the semiconductor laser device 2 used in a semiconductor laser module according to an embodiment of the present invention. FIGS. 18(A) and 18(B) are explanatory diagrams for illustrating a structure of the semiconductor laser device 2 used in a semiconductor laser module of the present invention. FIG. 19 is an explanatory diagram showing another example of the semiconductor laser device 2. FIG. 18(B) is a sectional view taken along the line a-a of FIG. 18(A).

The semiconductor laser device 2 has a structure shown in FIG. 18(A). In FIG. 18(A), a laminate structure 25, which will be described later, is formed on a substrate 24 of a given semiconductor through epitaxial crystal growth of a given semiconductor by a known epitaxial growth method such as organic metal vapor phase growth, the liquid phase method, molecular beam epitaxy, or gas source molecular beam epitaxy. After that, a lower electrode 26 is formed on the bottom face of the substrate 24, and an upper electrode 27 is formed on the top face of the laminate structure 25. A given resonator length L3 is obtained by cleaving, and a low reflection film 28 (having a reflectivity of 5% or less, for example) is formed on one of the cleaved surfaces (the front end face 2a) whereas a high reflection film 29 (having a reflectivity of 90% or more, for example) is formed on the other cleaved surface (the rear end face 2b).

As shown in FIG. 18(B), the laminate structure 25 on the substrate 24 is, for example, a BH structure (Buried Heterostructure). To give an example, an n-IhP clad layer 31, an active layer 32 of GRIN-SCH-MQW (Graded Index Separate Confinement Heterostructure Multi Quantum Well) formed from a GaInAsP multilayer film, and a p-InP clad layer 33 are layered in order on the substrate 24 formed of InP. A buried layer 34 formed of, for example, p-InP and a cap layer 35 formed of, for example, p-GaInAsP are layered on the p-InP clad layer 33. The upper electrode 27 is formed on the cap layer 35, and the lower electrode 26 is formed on the bottom face of the substrate 24.

The lower n-InP clad layer 31, the active layer 32 and the p-InP clad layer 33 are processed to form two stripes which are parallel to each other across a gap of 40 to 60 µm. A p-InP blocking layer 36 and an n-InP blocking layer 37 are layered in this order beside the stripes, thereby forming a narrow portion for injecting current to the active layer 32.

From the viewpoint of increasing output, it is advantageous for the active layer 32 to employ a compressive strain quantum well structure that sets the lattice mismatch rate with respect to the substrate 24 to 0.5% or more and 1.5% or less and a multiple quantum well structure having about five wells. If a barrier layer of the strain quantum well structure has a strain compensation structure in which tensile strain opposite to the strain of a well layer is introduced, the lattice match condition is met equivalently. Therefore, the well layer may have a higher degree of lattice mismatch.

In this embodiment, the laser beam emission portions composed of the lower n-InP layer 31, the GRIN-SCH-MQW active layer 32, and the p-InP clad layer 33 extend in the direction perpendicular to the paper surface of FIG. 18(B) forming a stripe pattern, and are referred to as the strip 9 and the stripe 10.

The semiconductor laser device 2 is adhered on the upper electrode 27 side to the heat sink 58 shown in FIG. 6(B) by solder using AuSn or the like. Upon receiving a current supplied from the external through the upper electrode 27 (the p side in this embodiment) and the lower electrode 26 (the n side in this embodiment), the two stripes simultaneously start laser oscillation and emit the two laser beams K1 and K2 through the low reflection film 28.

If the two stripes have completely identical characteristics, the threshold current of the semiconductor laser device 2 according to this embodiment is twice larger than when there is only one stripe, and the total laser light output is twice the laser light output of a semiconductor laser device that has one stripe. In other words, when driven with a current approximately twice the current for driving one stripe, the semiconductor element 2 produces in total approximately twice larger light output, and the slope efficiency of the semiconductor laser device 2 is equal to that of when there is one stripe.

In the example described above, the semiconductor laser device 2 has an InP-based BH structure. Another example is shown in FIG. 19 in which the semiconductor laser device 2 is of GaAs-based ridge waveguide type. The semiconductor laser device 2 shown in FIG. 19 has two ridge portions by layering an n type lower clad layer 41, an active layer 42, a p type upper clad layer 43, an insulating layer 44, and a p-GaAs layer 45 on a substrate 40 formed of n-GaAs. An upper electrode (p electrode) 46 is formed on the insulating layer 44 and the p-GaAs layer 45. A lower electrode (n electrode) 47 is formed on the bottom face of the substrate 40.

The ridge portions extend in the direction perpendicular to the paper surface of FIG. 19 forming a stripe pattern, and portions of the active layer 42 that are directly below the ridge portions emit laser beam. The laser beam emission portions are referred to as the stripes 9 and 10. It is also possible to form a ridge type LD from an InP-based material.

Figure 13:
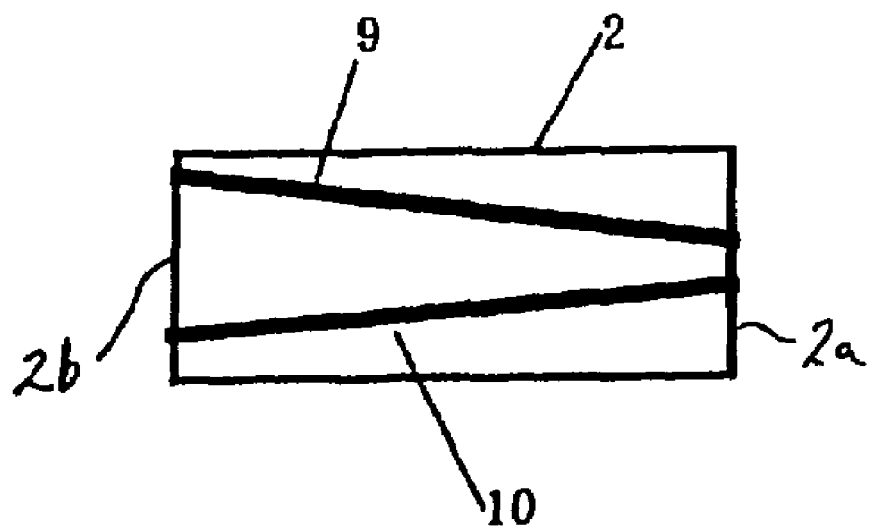
FIG. 13 is an explanatory diagram showing another example of the semiconductor laser device.

The first and second stripes 9 and 10 of the semiconductor laser device 2 described above are formed extending in parallel to each other in the longitudinal direction. The first and second stripes 9 and 10 may, however, for instance, be formed nonparallelly as shown in FIG. 13 without being limited to the parallelism. Referring to FIG. 13, the right side is a direction in which the laser beams are emitted, and the space between the stripes 9 and 10 becomes narrower as it gets closer to the right side edge. In this case, the two first and second laser beam K1 and K2 emitted from the two stripes 9 and 10 intersect each other at a comparatively short distance from the semiconductor laser device 2, and, after traveling through the first lens 4, sufficiently split to such a degree that the half-wave plate 6 can be inserted only on the optical path of the first laser beam K1 (which implies that a divergent width D' becomes sufficiently large in FIG. 7). Therefore, a required propagation distance (L in FIG. 7) decreases, and hence the length of the semiconductor laser module in the optical-axis direction can be reduced.

The propagation length L can be shortened also by taking the reverse method to FIG. 13 and increasing the gap between the stripes 9 and 10 progressively toward the right side.

Sixth Embodiment

Figure 20A:
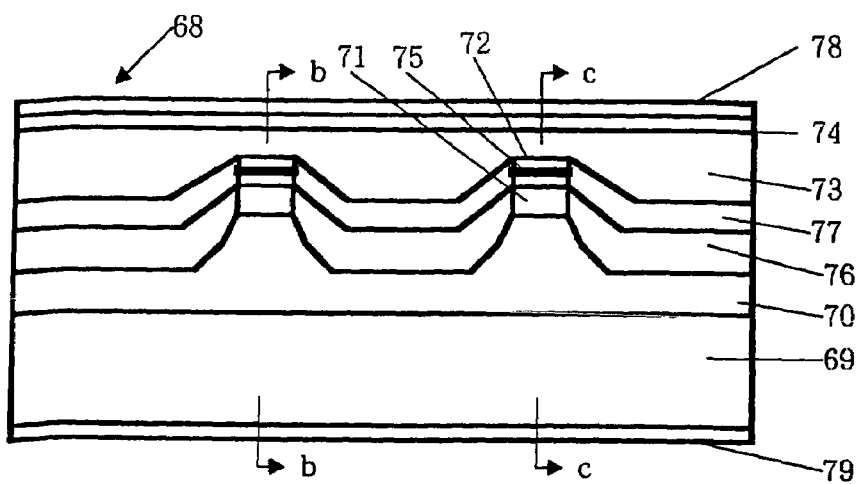
FIGS. 20(A) to (C) are explanatory diagrams showing a structure of a semiconductor laser device used in a semiconductor laser module in accordance with a sixth embodiment of the present invention, of which FIGS. 20(B) and (C) are cross sectional diagrams taken respectively along the line b-b and c-c in FIG. 20(A)
Figure 20B:
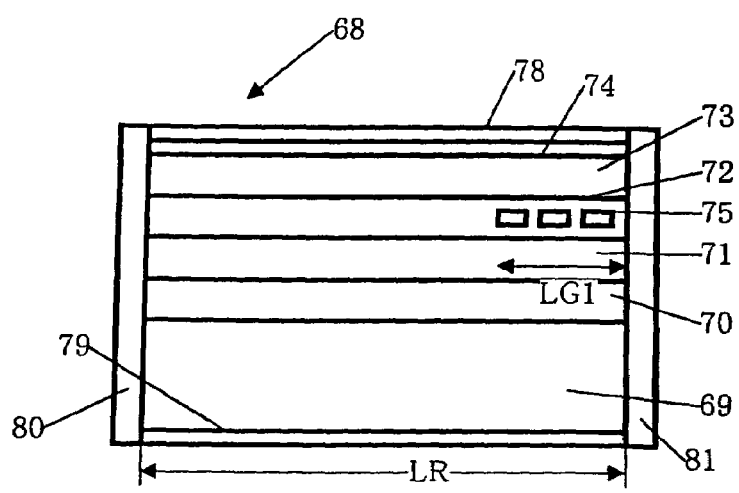
Figure 20C:
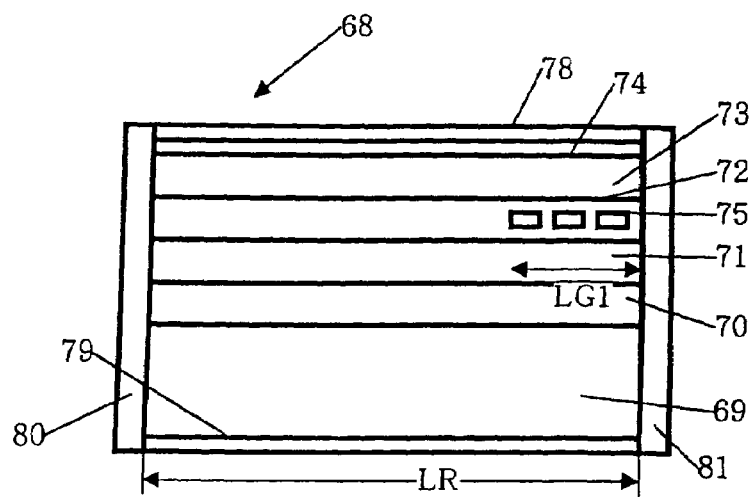

FIGS. 20(A) to 20(C) show a semiconductor laser device 68 used for the semiconductor laser module in accordance with a sixth embodiment of the present invention and having a different configuration from the semiconductor laser device 2 shown in FIG. 18. FIGS. 20(B) and 20(C) are sectional views taken along the line b-b and the line c-c in FIG. 20(A), respectively.

In the sixth embodiment, a diffraction grating 75 that chooses laser light having a given central wavelength $\lambda_0$ is formed in each stripe of the semiconductor laser device 68 to thereby stabilize the wavelength of the laser beam K1 and K2 emitted from the stripes.

As shown in FIG. 20, the semiconductor laser device 68 in the sixth embodiment has a structure that an n-InP buffer layer 70 doubling as a buffer layer and a lower clad layer, a GRIN-SCH-MQW active layer 71, a p-InP spacer layer 72, an embedded layer 73, and an InGaAsP gap layer 74, are laminated sequentially on a surface (100) of an n-InP substrate 69.

Within the two stripes 9 and 10, p-InGaAs diffraction gratings 75 each having a thickness on the order of 20 nm are formed periodically at a predetermined pitch. The diffraction grating 75 has a given length LG1 from a second reflection film 81, which is a low reflection film having a reflectance of 2% or less, desirably 1% or less, more desirably 0.2% or less, toward a first reflection film 80, which is a high reflection film having a reflectance of 80% or more. The diffraction grating 75 is not formed beyond the given length LGI.

Laser light whose central wavelength $\lambda_0$ is 1,300 nm to 1,550 nm is selected by the diffraction grating 75. A resonator length $L_R$ is set to 800 or longer. The semiconductor laser device 68 has the same structure as the semiconductor laser device 2 (FIG. 18) used in the fifth embodiment except for the above-mentioned structure.

The laser lights generated within the GRIN-SCH-MQW active layer 71 of an optical resonator formed of the first and second reflection films 80 and 81, are amplified while repeating reflection between the first reflection film 80 and the second reflection film 81, and exit as laser lights via the second reflection film 81.

When an equivalent refractive index is represented by "n", a mode interval $\Delta\lambda$ of the longitudinal mode occurred by the resonator of the semiconductor laser device is generally expressed by the following formula.

Namely;

$$\Delta\lambda = \lambda_0^2 / (2 \cdot n \cdot L_R).$$

For example, if the oscillation wavelength $\lambda_0$ is set to 1480 µm and an equivalent refractive index is set to 3.5, when the cavity length is 800 µm, the longitudinal mode interval $\Delta\lambda$ is approximately 0.39 nm. When the cavity length is 3200 the longitudinal mode interval $\Delta\lambda$ is approximately 0.1 nm. That is, as the cavity length is set larger, the longitudinal mode interval $\Delta\lambda$ becomes narrower, which means that in general, as the cavity length is set larger, the selection condition for oscillating the laser lights of the single longitudinal mode gets more strict.

Figure 21:
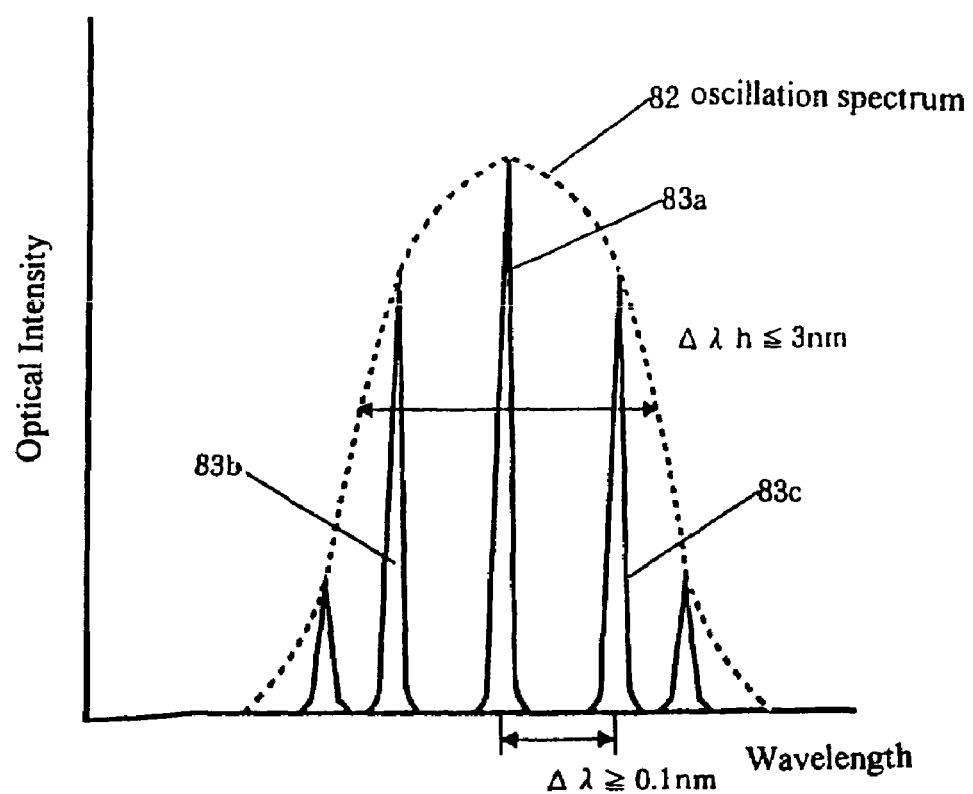
FIG. 21 is a graph showing a relation between the oscillation spectrum and longitudinal modes of the semiconductor laser device used in the semiconductor laser module in accordance with the sixth embodiment of the present invention.

On the other hand, the diffraction grating 75 formed in each stripes of the semiconductor laser device in this embodiment selects the longitudinal mode with a Bragg wavelength thereof. A selection wavelength characteristic of this diffraction grating 75 is given as an oscillation wavelength spectrum 82 shown in FIG. 21.

In this embodiment, such a structure is employed that a plurality of oscillation longitudinal modes exist within the wavelength selection characteristic shown by a half-value width $\Delta\lambda_h$ of the oscillation wavelength spectrum by the semiconductor laser device including the diffraction gratings 75.

The conventional semiconductor laser device such as distributed feed back (DFB), if the cavity length $L_R$ is set to 800 μm or larger, is difficult of the single longitudinal oscillations. Therefore, the semiconductor laser device having the above cavity length $L_R$ is not used. In the semiconductor laser device 68 in this embodiment, however, the cavity length $L_R$ is positively set to 800 μm or larger, and the length LG1 of the diffraction grating 75 or a coupling coefficient is changed. Accordingly, the half-value total width $\Delta\lambda_h$ of the oscillation wavelength spectrum 82 is changed, thereby increasing the number of longitudinal modes within the half-value total width $\Delta\lambda_h$. For example, in FIG. 21, the half-value width total $\Delta\lambda_h$ of the oscillation wavelength spectrum contains three oscillation longitudinal modes 83a to 83c.

That is, as the coherent length of laser light to be depolarized becomes shorter, the depolarizing element 110 is required to have a shorter length for depolarization. The coherent length of oscillation laser light is shorter in the semiconductor laser device 68 of the sixth embodiment, where the diffraction grating 75 is provided in each stripe waveguide and there are three or more, desirably four or more, oscillation longitudinal modes in the half width $\Delta\lambda_h$ of the oscillation spectrum of each stripe, than in the case where a single mode is used for laser oscillation. Therefore, the use of the semiconductor laser device 68 according to the sixth embodiment provides laser light of stable oscillation wavelength and makes the length of the depolarizing element 110 necessary for depolarization shorter. In addition, having the diffraction grating 75 in each stripe, the semiconductor laser device 68 of the sixth embodiment can provide laser light that is lower in relative intensity noise (RIN) than when oscillation wavelength is stabilized by a fiber Bragg grating (FBG). The semiconductor laser device 68 is therefore suitable as a pumping light source for a low noise Raman amplifier.

In the semiconductor laser device 68 according to the sixth embodiment that has plural oscillation longitudinal modes in the half width $\Delta\lambda_h$ of the oscillation spectrum, the intensity per oscillation longitudinal mode is lower than in a semiconductor laser device which has the same total laser light output and oscillates in a single longitudinal mode.

Figures 22A, 22B:
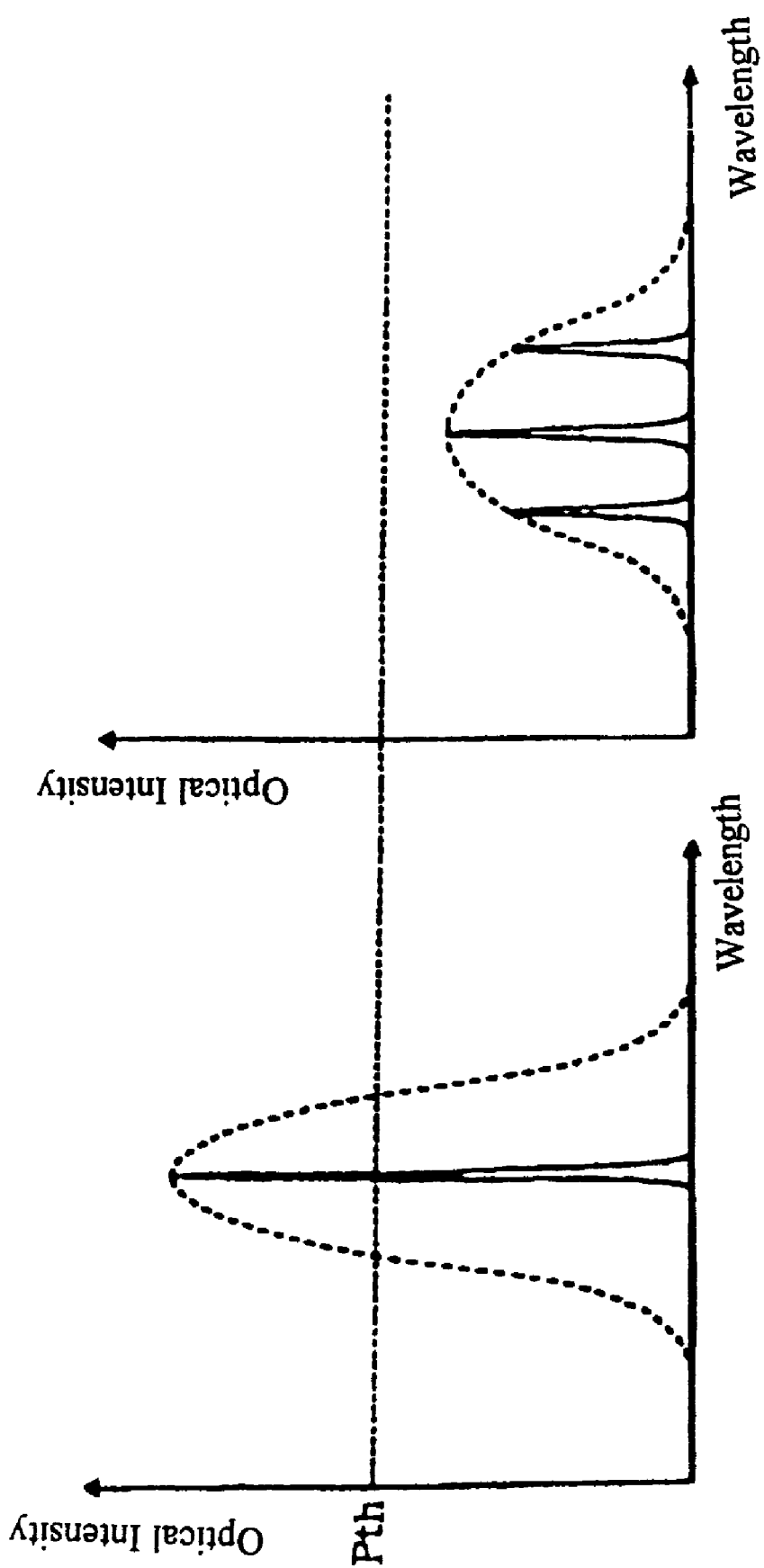
FIGS. 22(A) and (B) are diagrams showing a relation between the intensity of the longitudinal modes and the threshold of stimulated Brillouin scattering for the cases of single longitudinal mode oscillation and of multi longitudinal mode oscillation, respectively.

FIG. 22(A) is a schematic diagram showing a spectrum of a oscillation longitudinal mode of when the semiconductor laser device 68 oscillates in a single oscillation longitudinal mode. FIG. 22(B) is a schematic diagram showing a spectrum of each oscillation longitudinal mode of when the semiconductor laser device 68 oscillates in plural oscillation longitudinal modes. The laser light output is the same for FIG. 22(A) and FIG. 22(B). A dashed line denoted by Pth in each of FIGS. 22(A) and 22(B) indicates the threshold for stimulated Brillouin scattering (SBS) (referred to as SBS threshold). In the semiconductor laser device 68 according to the sixth embodiment that has plural oscillation longitudinal modes in the half width $\Delta\lambda_h$ of the oscillation spectrum, the intensity per oscillation longitudinal mode can be limited to the SBS threshold or lower. Therefore, the incidence of SBS is reduced, and amplification high in gain and low in noise can be obtained.

In oscillation in plural oscillation longitudinal modes, too wide an oscillation spectrum leads to a large loss in multiplexing by a wavelength multiplexing coupler, and in some cases, fluctuation in longitudinal mode within the oscillation spectrum could cause noise and gain fluctuation. For that reason, the half width $\Delta\lambda_h$ of the oscillation spectrum 82 is set to 3 nm or less, preferably 2 nm or less.

Seventh Embodiment

In the semiconductor laser module of the sixth embodiment, the diffraction grating 75 provided in each of the two stripes selects approximately the same wavelength. On the other hand, a semiconductor laser module of the seventh embodiment is a modification of the sixth embodiment, and the diffraction grating 75 in one stripe chooses a wavelength different from the one selected by the diffraction grating 75 in the other stripe. In this way, two laser beams K1 and K2 having different wavelengths are subjected to polarization synthesis, and the resultant synthesized beam is depolarized by the depolarizing element 110.

Preferably, the oscillation wavelength selected by the diffraction grating in one stripe is set different from the oscillation wavelength selected by the diffraction grating in the other stripe so that the wavelengths of the oscillation longitudinal modes of the laser beam K1 and K2 emitted from the stripes do not overlap each other in oscillation longitudinal modes of high intensity.

Figure 23:
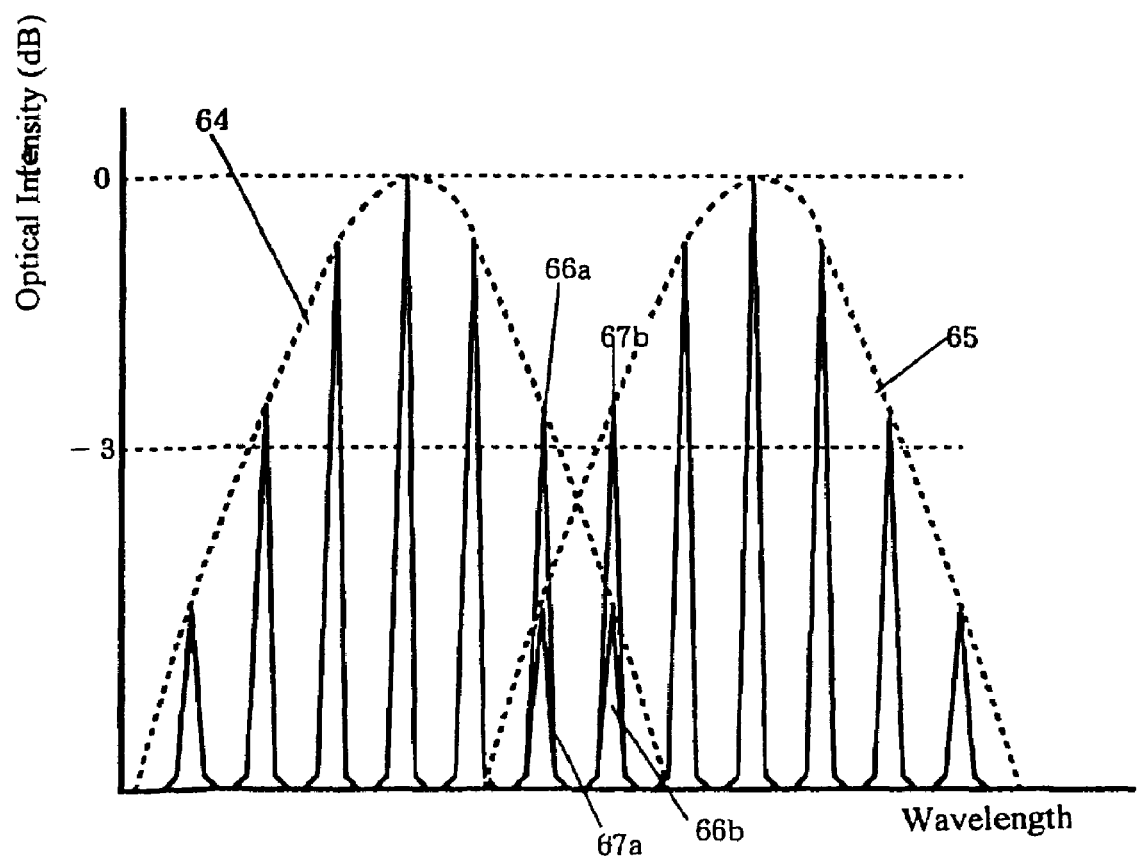
FIG. 23 is a graph showing an optical intensity to wavelength characteristics for explaining a seventh embodiment of the present invention.

For instance, different oscillation wavelengths are set such that a spectrum envelope curve 64 of the laser beam K1 from one stripe does not overlap a spectrum envelope curve 65 of the laser beam K2 from the other stripe in an area where the intensity is equal to or higher than a given level as shown in FIG. 23. Specifically, the difference between central wavelengths selected by the diffraction gratings of the stripes is set such that the oscillation spectra 64 and 65 do not cross each other in an area where the difference from the maximum laser light intensity is 3 dB or less. In the schematic diagram of FIG. 23, an oscillation longitudinal mode 66a that belongs to the oscillation spectrum 64 overlaps an oscillation longitudinal mode 67a that belongs to the oscillation spectrum 65, but the difference between the intensity of the oscillation longitudinal mode 67a and the maximum laser light intensity is 3 dB or more. Accordingly, even though two such laser beams enter the depolarizing element 110 while being angled at 45 degrees with respect to the principal axis and are distributed as polarization components along the principal axis, interference is reduced and affects the degree of polarization of synthesized laser light less. In addition, the fact that an oscillation longitudinal mode 67b that belongs to the oscillation spectrum 65 overlaps an oscillation longitudinal mode 66b that belongs to the oscillation spectrum 65 does not affect the degree of polarization of the synthesized laser light from the same reason.

In order to reduce the degree of polarization further, the difference between central wavelengths selected by the diffraction gratings of the stripes is set such that the oscillation spectra 64 and 65 do not cross each other in an area where the difference from the maximum laser light intensity is 10 dB or less.

Figure 24:
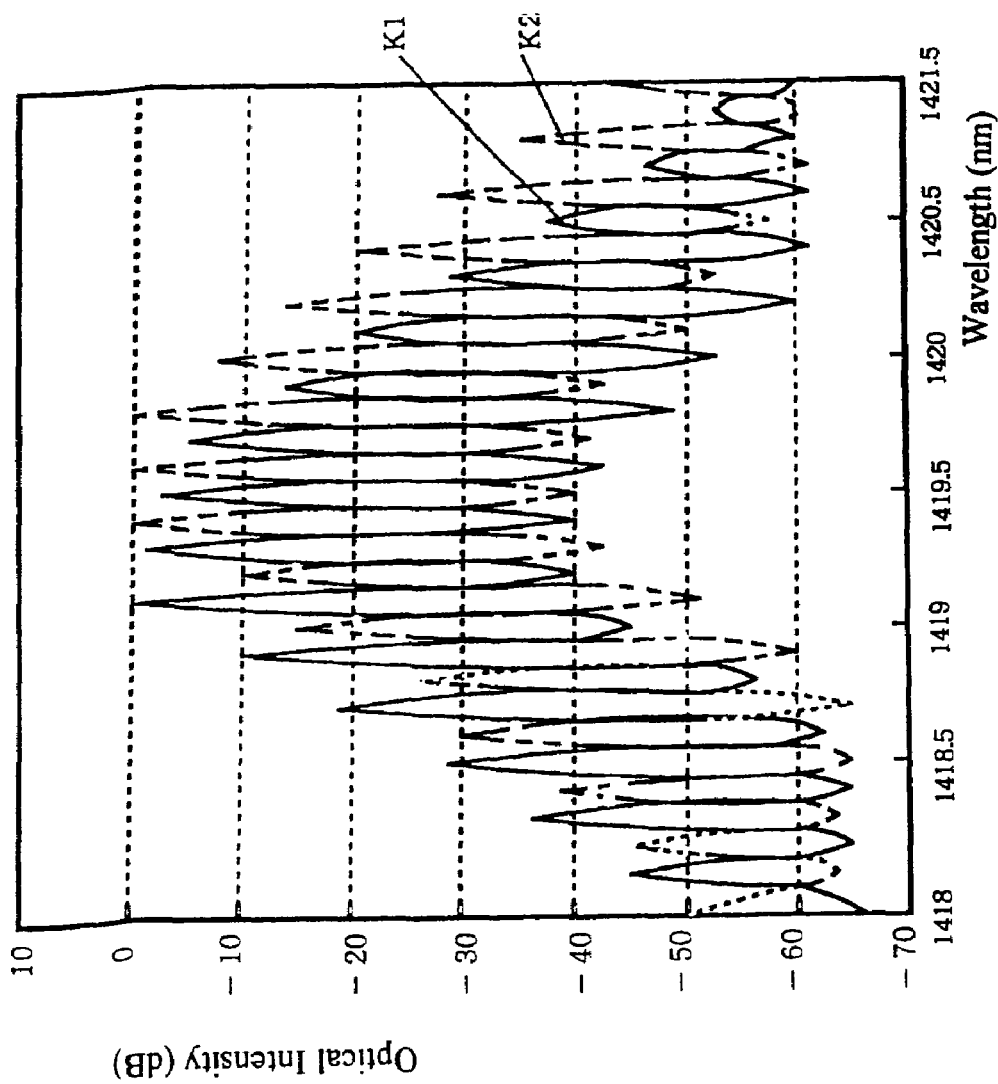
FIG. 24 is a graph showing an optical intensity to wavelength characteristics for explaining a seventh embodiment of the present invention.

In still another mode, the oscillation longitudinal modes of the laser K2, when the spectrum of the laser beam K1 and the spectrum of the laser beam K1 and K2 emitted from the stripes may be arranged such that every oscillation longitudinal mode of the laser beam K1 has a wavelength different from that of every oscillation longitudinal mode of the laser beam K2, more desirably, that the wavelength of each oscillation longitudinal mode of the laser beam K1 is approximately in the middle of wavelengths of adjacent two oscillation longitudinal modes of the laser beam K2 overlap each other in an area where the intensity is high as in FIG. 24, for example. Even though such two laser beams enter the depolarizing element 110 while being angled at 45 degrees with respect to the principal axis and are distributed as polarization components along the principal axis, interference is reduced and affects the degree of polarization of synthesized light less. In order to arrange longitudinal modes alternately in this manner, stripe beam emission portions of the semiconductor laser device shown in FIG. 18, FIG. 19, or FIG. 20 are given different heat dissipating abilities by, for example, setting a first stripe width L1 different from a second stripe width L2, so that the active layer temperature differs from one stripe to the other. The other mode described above is applicable not only to the semiconductor laser device in FIG. 20 which has a diffraction grating in each stripe but also to the semiconductor laser devices of FIG. 18 and FIG. 19 which have no diffraction gratings.

Eighth Embodiment

Figure 25:
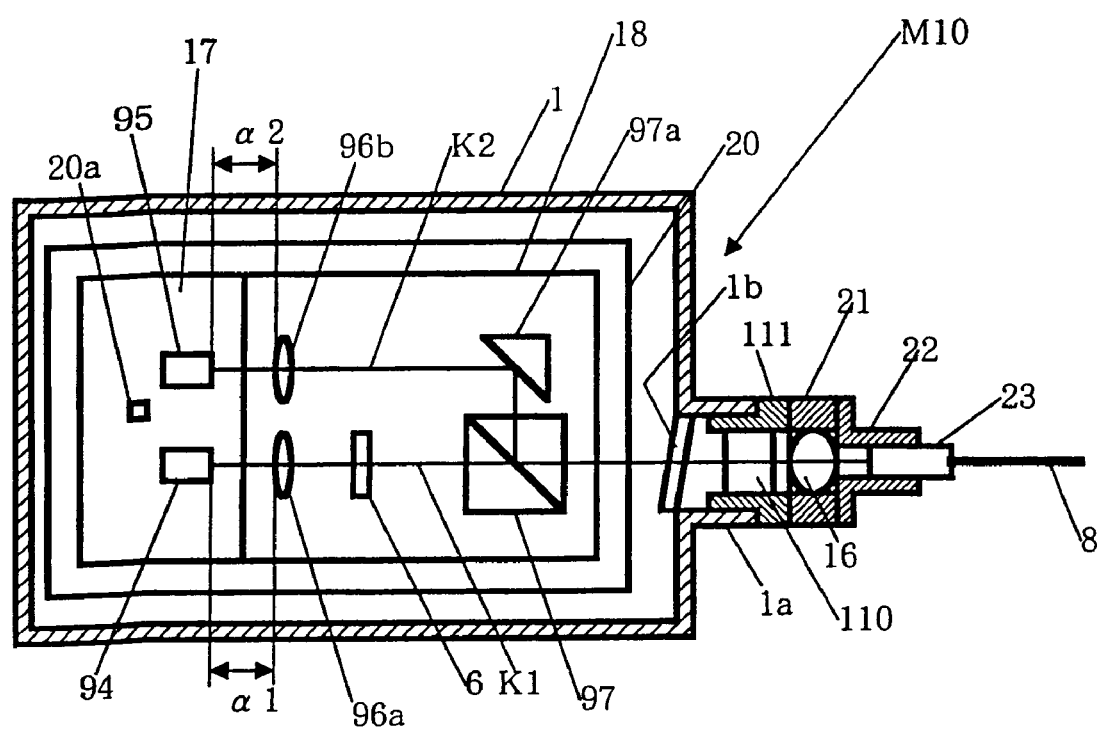
FIG. 25 is an explanatory diagram schematically showing a configuration of a semiconductor laser module in accordance with an eighth embodiment of the present invention.
Figure 25:
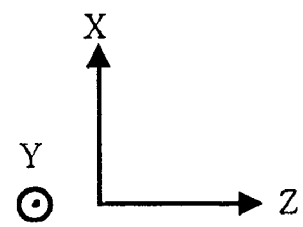

FIG. 25 is a plan view showing a semiconductor laser module according to an eighth embodiment of the present invention. As shown in FIG. 25, a semiconductor laser module M10 according to the eighth embodiment of the present invention has: a first semiconductor laser device 94 for emitting first laser beam K1; a second semiconductor laser device 95 for emitting second laser beam K2; two first lenses 96a and 96b where the two laser beam beams K1 and K2 emitted from the two semiconductor laser devices 94 and 95 enter, respectively, to be separately collimated; a polarized wave synthesizing element (cube beam splitter) 97; a mirror 97a for reflecting the laser beam K2 toward the polarized wave synthesizing means 97; and a depolarizing element 110 for depolarizing synthesized light that has exited the polarized wave synthesizing element 97. The eighth embodiment has a similar structure to the fifth embodiment except for the above-mentioned structure. The depolarizing element 110 is fixed to the flange portion 1a through the holder member 111. Alternatively, the depolarizing element 110 may be fixed to the third supporting member 112 that is fixed onto the second base 18 as in the modification example of the fifth embodiment.

Ninth Embodiment

Figure 26:
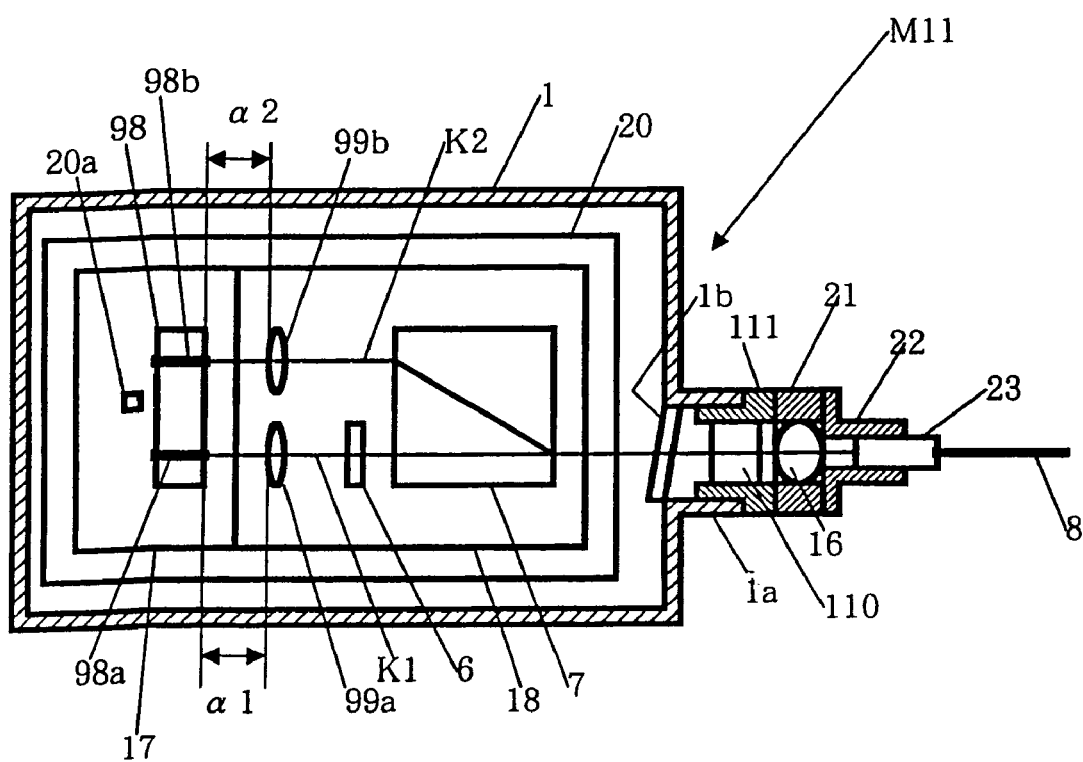
FIG. 26 is an explanatory diagram schematically showing a configuration of a semiconductor laser module in accordance with a ninth embodiment of the present invention.
Figure 26:
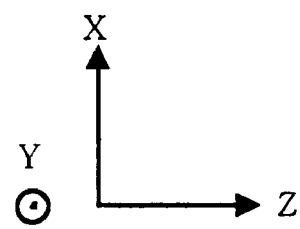

FIG. 26 is a plan view showing a semiconductor laser module according to a ninth embodiment of the present invention.

A semiconductor laser module M11 according to the ninth embodiment has: a semiconductor laser device 98 which is an array laser equipped with a first stripe 98a and a second stripe 98b that are parallel to each other across a gap of about 500 μm; a first lens 99a where first laser beam K1 emitted from the first stripe 98a enters to be collimated; and a second lens 99b where second laser beam K2 emitted from the second stripe 98b enters to be collimated. The ninth embodiment has a similar structure to the fifth embodiment except for the above-mentioned structure.

The depolarizing element 110 is fixed to the flange portion 1a through the holder member 111. Alternatively, the depolarizing element 110 may be fixed to the third supporting member 112 that is fixed onto the second base 18 as in the modification example of the fifth embodiment.

The ninth embodiment uses as a semiconductor laser device an array laser that has two stripes (the gap between the stripes is about 500 μm). Alternatively, two semiconductor laser devices each having one stripe may be arranged parallel to each other across a narrow gap. The first lens may be a lens array.

In the eighth embodiment which uses the two laser devices (see FIG. 25) or in the ninth embodiment which uses the array laser having a wide gap between stripes (see FIG. 26), the amount of current flowing into one stripe is sometimes set different from the current amount in the other stripe in order to compensate a difference in characteristics between the two characteristics. However, in the present invention, synthesized light of low degree of polarization can be obtained from the output end of the optical fiber 8 without strict current adjustment because of the depolarizing element 110.

In the eighth and ninth embodiments, each stripe may be provided with a diffraction grating which selects laser light of given wavelength as shown in the sixth or seventh embodiment.

Tenth Embodiment

In a tenth embodiment, the semiconductor laser module according to the first through ninth embodiment is applied to an optical amplifier (Raman amplifier).

Figure 27:
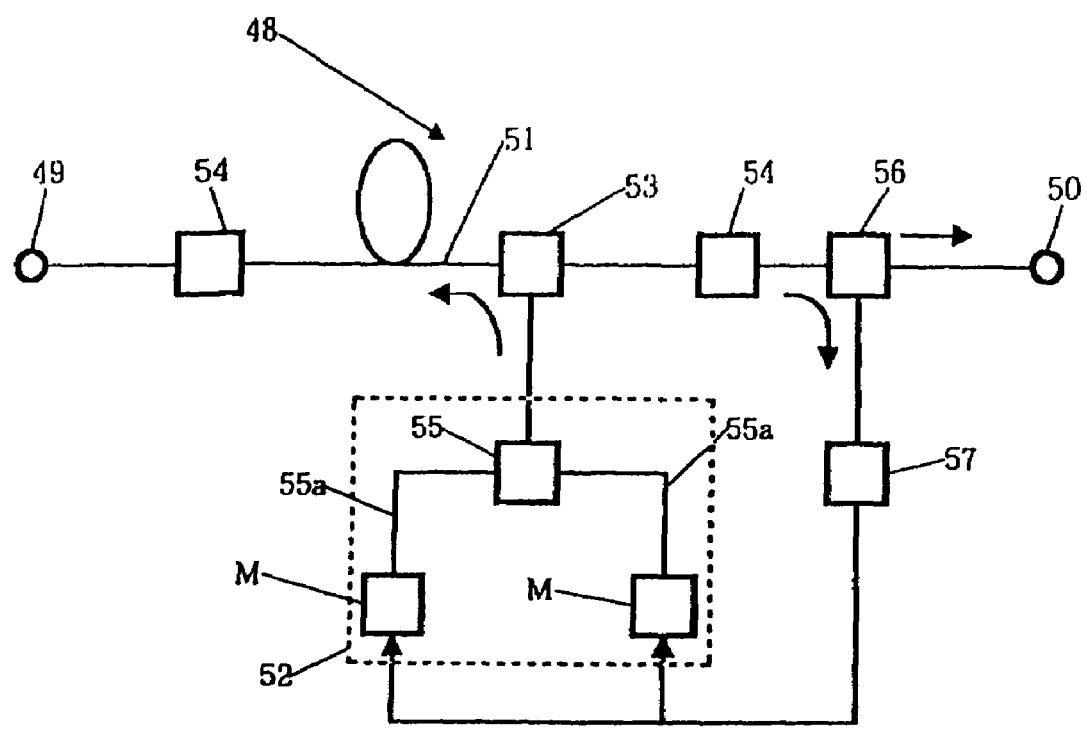
FIG. 27 is a block diagram showing a configuration of a Raman amplifier in accordance with a tenth embodiment of the present invention.
Figure 28:
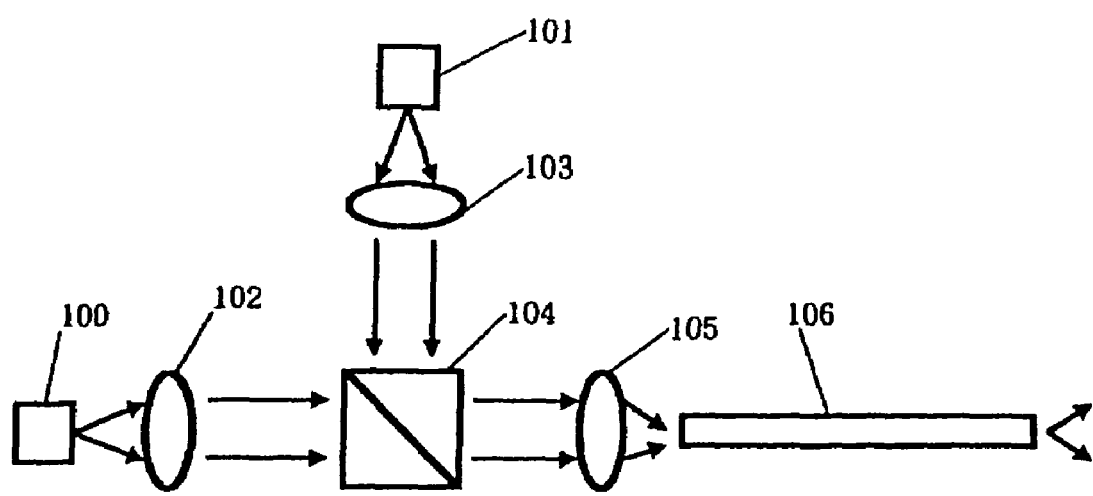
FIG. 28 is an explanatory diagram showing a conventional semiconductor laser apparatus as disclosed in U.S. Pat. No. 5,589,684.
Figure 28:
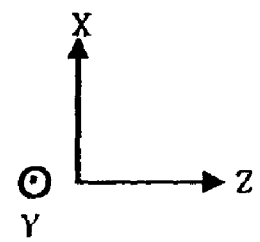
Figure 29:
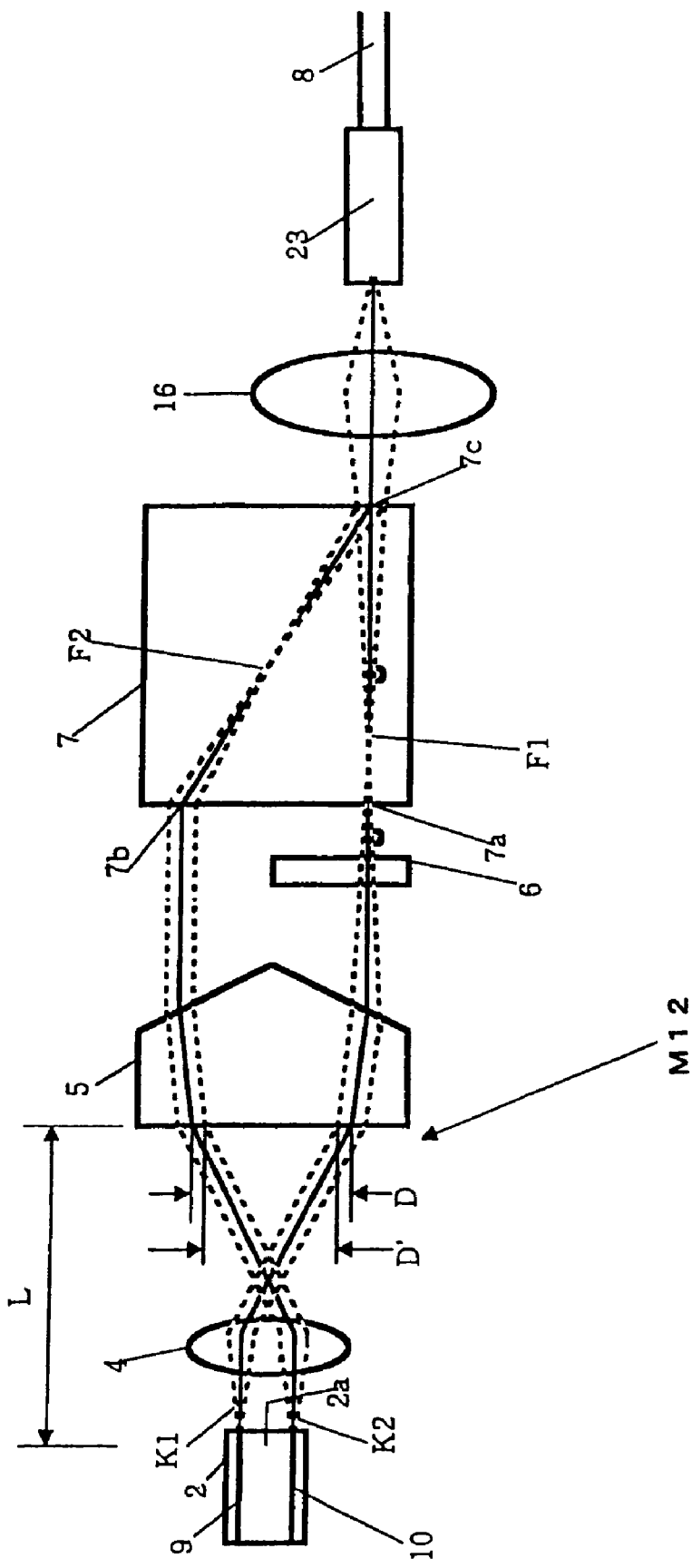
FIG. 29 is an explanatory diagram schematically showing a configuration of the semiconductor laser module of the related art.

FIG. 27 is a block diagram showing a configuration of a Raman amplifier in accordance with the tenth embodiment of the present invention. The Raman amplifier is used in a WDM transmission communication system, for instance.

As shown in FIG. 27, the Raman amplifier 48 according to the tenth embodiment of the present invention comprises an input portion 49 to which a signal light is inputted, an output portion 50 from which the signal light is outputted, an optical fiber (an amplification fiber) 51 for transmitting the signal light between the input portion 49 and the output portion 50, a pumping light generating unit 52 for generating a pumping light, and a WDM coupler 53 for coupling the pumping light generated by the pumping light generating unit 52 and the signal light transmitted in the optical fiber (the amplification fiber) 51. Optical isolators 54 are disposed between the input portion 49 and the WDM coupler 53, and between the output portion 50 and the WDM coupler 53 as well, each allowing the signal light to be transmitted only in the direction from the input portion 49 to the output portion 50.

The pumping light generating unit 52 comprises a plurality of the semiconductor laser modules M according to any embodiment of the present invention each generating a laser light of a different wavelength from the others, and a WDM coupler 55 for synthesizing the laser lights generated from the plurality of semiconductor laser modules M.

The pumping lights generated by the semiconductor laser modules M, being transmitted through the polarization maintaining fibers 55a and synthesized by the WDM coupler 55, constitute the output light of the pumping light generating unit 52.

The pumping light outputted from the pumping light generating unit 52 is coupled with the optical fiber 51 through the WDM coupler 53, when the signal light inputted to the input portion 49 is mixed with the pumping light in the optical fiber 51. The signal light is then amplified, transmitted through the WDM coupler 53, and outputted from the output portion 50.

The signal light amplified in the optical fiber 51 (the amplified signal light) is transmitted through the WDM coupler 53 and the optical isolator 54, and then enters a monitor light distribution coupler 56, where a part of the amplified signal light is distributed to a control circuit 57 and the remaining part of it is outputted from the output portion 50 as the output signal light.

The control circuit 57 controls the laser emission state, such as the intensity, of optical output of each of the semiconductor laser modules M, on the basis of the part of the inputted amplified optical signal, and performs a feedback control of the semiconductor laser modules M such that a resultant optical amplification gain is flat over the wavelength.

The Raman amplifier 48, since it utilizes the semiconductor laser module in which the output beams from the stripes are polarization-synthesized and further depolarized through the polarization maintaining fiber 8, is capable of obtaining an amplification gain which is not only high but also stable irrespective of the state of polarization of the signal light.

In addition, if it utilizes the semiconductor laser module in which the semiconductor laser device further includes a diffraction grating 75 formed within each stripe, it is possible to reduce the noises added onto the amplified signal due to a reduced relative intensity noise (RIN) of the pumping light as compared with the case where the semiconductor laser module with a FBG is used. Still further, it is possible to suppress the occurrence of stimulated Brillouin scattering of the pumping light, whereby the amplification can be performed with low extra noises and high gain.

In FIG. 27, the Raman amplifier is realized as a backward pumped amplifier. However, it should be noted that since the Raman amplifier utilizes the semiconductor laser module emitting a depolarized pumping light of low relative intensity noise (RIN), it is possible to obtain a stable gain irrespective of the state of polarization of the signal light, even if it is realized as any of a forward pumped amplifier or a bi-directional pumped amplifier.

Obviously, the present invention is not limited to the embodiments described above, and additional numerous modifications and variations of the present invention are possible within the scope of the appended claims.

According to the present invention, laser light with reduced degree of polarization can be obtained from an optical fiber with a simple and inexpensive structure because of a depolarizing element which depolarizes laser light emitted from a semiconductor laser device. In addition, by placing the depolarizing element behind a polarized wave synthesizing element which combines two polarized laser lights emitted from the semiconductor laser device, sufficiently depolarized laser light can be obtained steadily from the optical fiber even when polarization synthesis by the polarized wave synthesizing element is not enough to achieve low degree of polarization on the desired level due to a difference in intensity, spreading angle, optical length of the propagation light path, amount of attenuation experienced along the propagation light path, or the like between the two laser beams. Moreover, the present invention can avoid an increase in degree of polarization of the synthesized light which is caused by efficiency imbalance in coupling the two beam beams to the optical fiber, or degradation of one of the stripes, or other changes resulting from long term use. Accordingly, a semiconductor laser module of this embodiment is suitable as a pumping light source of a Raman amplifier in which polarization dependency of the amplification gain has to be low.

What is claimed is:

1. A method of manufacturing a semiconductor laser module, comprising the steps of:
    fixing a semiconductor laser device having a stripe emitting a laser beam;
    holding a first lens for receiving said laser beam emitted from said stripe and a depolarizer for depolarizing said laser beam emitted from said first lens in an integrated common holder;
    measuring a degree of polarization of the laser beam emerging from said depolarizer while rotating said integrated common holder about an optical axis of said laser beam;
    positioning and fixing said integrated common holder at a position where said measured degree of polarization is not more than a predetermined value; and
    fixing an optical fiber for receiving and transmitting said laser beam emitted from said depolarizer.

2. A method of manufacturing a semiconductor laser module, comprising the steps of:
    fixing a semiconductor laser device having a stripe emitting a laser beam;
    holding a first lens for receiving said laser beam emitted from said stripe and a depolarizer for depolarizing said laser beam emitted from said first lens in an integrated common holder;
    measuring a degree of polarization of the laser beam emerging from said depolarizer while rotating said integrated common holder about an optical axis of said laser beam;
    positioning and fixing said integrated common holder at a position where said measured degree of polarization is not more than a predetermined value;
    fixing a second lens for receiving said laser beam emitted from said depolarizer; and
    fixing an optical fiber for receiving and transmitting said laser beam emitted from said second lens.

3. A method of manufacturing a semiconductor laser module, comprising the steps of:
    fixing a semiconductor laser device having a stripe emitting a laser beam;
    fixing a first lens for receiving said laser beam emitted from said stripe;
    holding a first lens for receiving said laser beam emitted from said stripe and a depolarizer for depolarizing said laser beam emitted from said first lens in an integrated common holder;
    measuring a degree of polarization of the laser beam emerging from said depolarizer while rotating said integrated common holder about an optical axis of said laser beam;
    positioning and fixing said integrated common holder at a position where said measured degree of polarization is not more than a predetermined value; and
    fixing an optical fiber for receiving and transmitting said laser beam emitted from said second lens.

* * * * *